(12) United States Patent
Cheng et al.

(10) Patent No.: US 12,324,185 B2
(45) Date of Patent: Jun. 3, 2025

(54) SEMICONDUCTOR DEVICE, FinFET DEVICE AND METHODS OF FORMING THE SAME

(71) Applicant: Taiwan Semiconductor Manufacturing Company, Ltd., Hsinchu (TW)

(72) Inventors: Po-Hsien Cheng, Hsinchu (TW); Jr-Hung Li, Hsinchu County (TW); Tai-Chun Huang, Hsin-Chu (TW); Tze-Liang Lee, Hsinchu (TW); Chung-Ting Ko, Kaohsiung (TW); Jr-Yu Chen, Taipei (TW); Wan-Chen Hsieh, Hsinchu (TW)

(73) Assignee: Taiwan Semicoductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/636,217

(22) Filed: Apr. 15, 2024

(65) Prior Publication Data
US 2024/0258390 A1  Aug. 1, 2024

Related U.S. Application Data

(60) Division of application No. 17/685,401, filed on Mar. 3, 2022, now Pat. No. 11,984,485, which is a continuation of application No. 16/805,862, filed on Mar. 2, 2020, now Pat. No. 11,271,083.

(60) Provisional application No. 62/906,745, filed on Sep. 27, 2019.

(51) Int. Cl.
H10D 30/62 (2025.01)
H10D 30/01 (2025.01)
H10D 62/13 (2025.01)
H10D 64/01 (2025.01)

(52) U.S. Cl.
CPC ....... *H10D 30/6219* (2025.01); *H10D 30/024* (2025.01); *H10D 30/6211* (2025.01); *H10D 62/151* (2025.01); *H10D 64/017* (2025.01)

(58) Field of Classification Search
CPC .......... H01L 29/41791; H01L 29/0847; H01L 29/66545; H01L 29/66795; H01L 29/7851; H10D 30/6219; H10D 30/6211; H10D 64/017; H10D 62/151; H10D 30/024
See application file for complete search history.

(56) References Cited

U.S. PATENT DOCUMENTS

2015/0243747 A1* 8/2015 Kittl ................. H01L 29/41791
257/401
2020/0152756 A1* 5/2020 Greene ............... H01L 27/0886

* cited by examiner

*Primary Examiner* — Christine A Enad
(74) *Attorney, Agent, or Firm* — JCIPRNET

(57) ABSTRACT

A semiconductor device includes a substrate, a gate structure on the substrate, a source/drain (S/D) region and a contact. The S/D region is located in the substrate and on a side of the gate structure. The contact lands on and connected to the S/D region. The contact wraps around the S/D region.

20 Claims, 23 Drawing Sheets

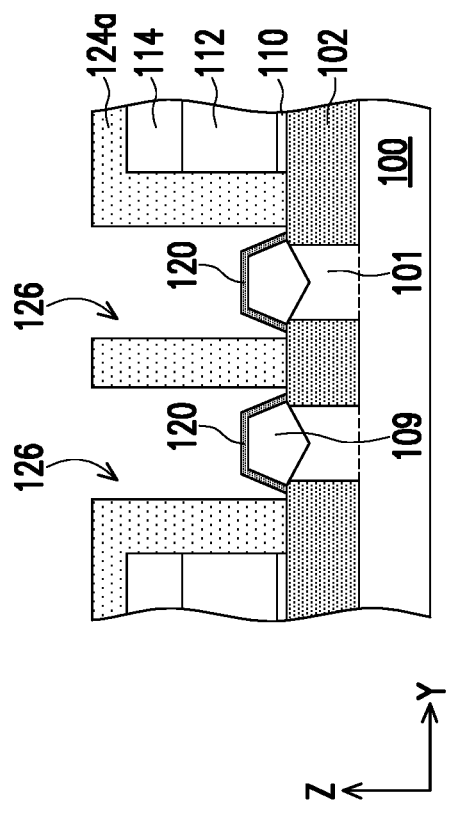
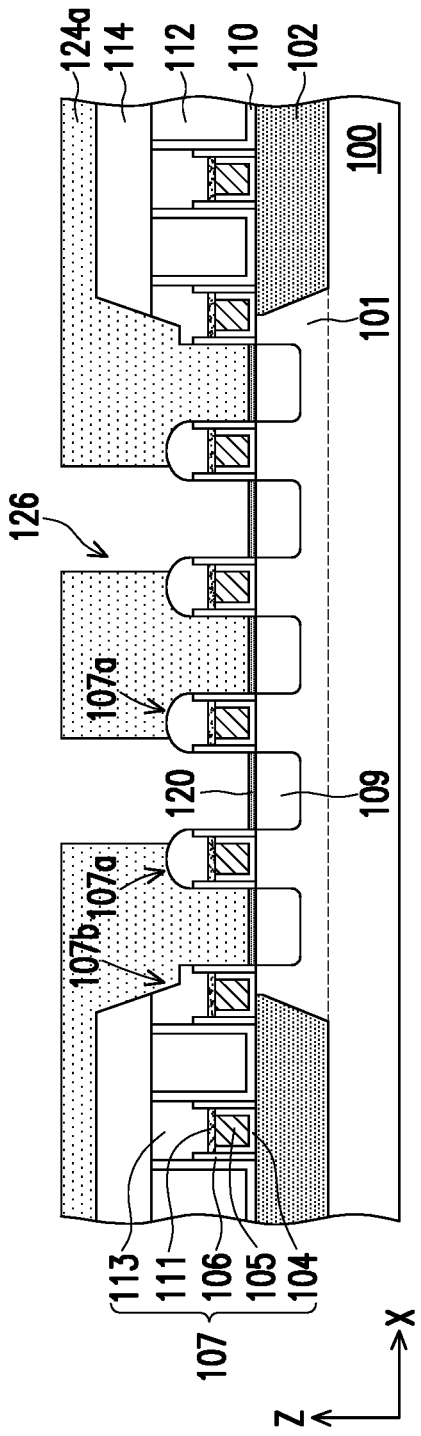
FIG. 8A
FIG. 8B

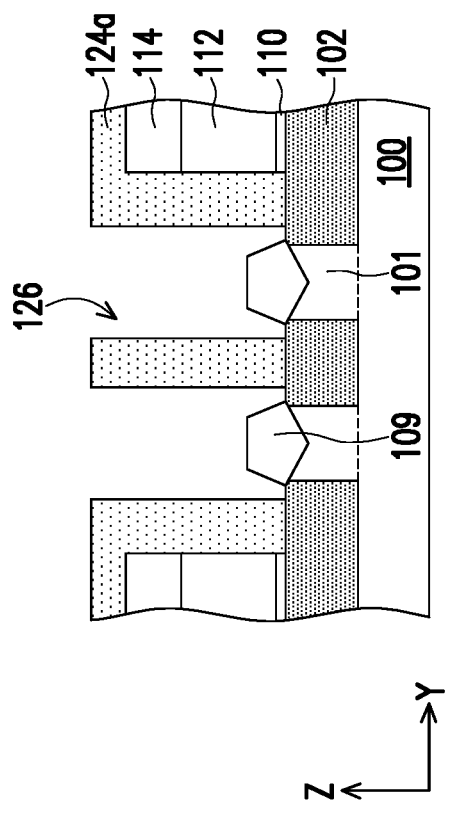
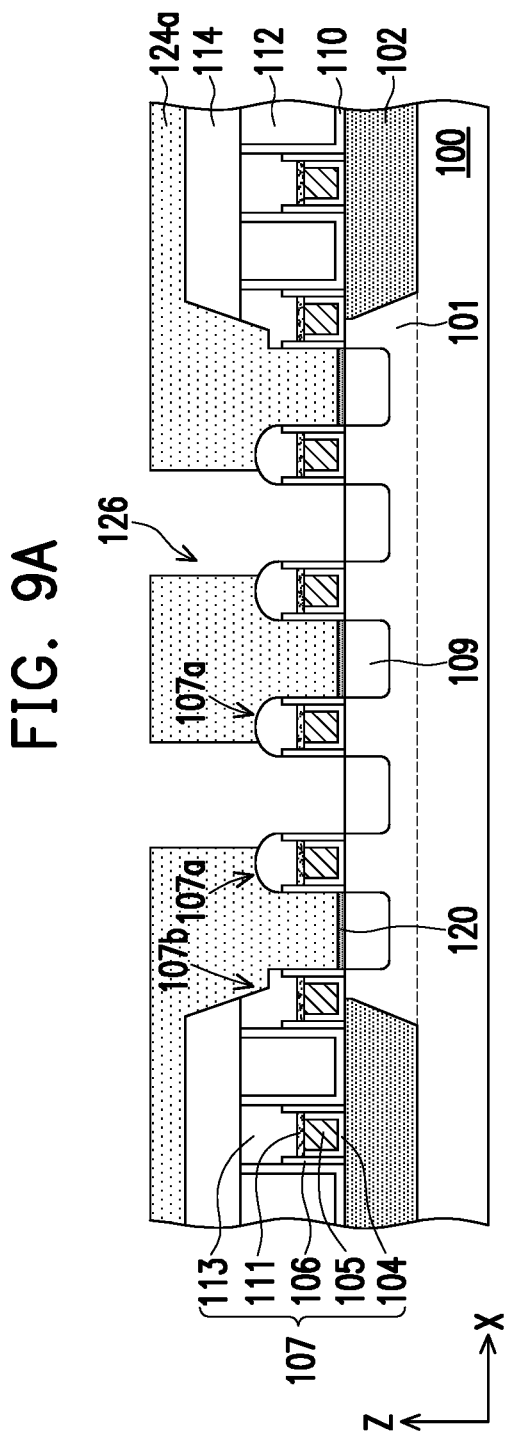
FIG. 9A
FIG. 9B

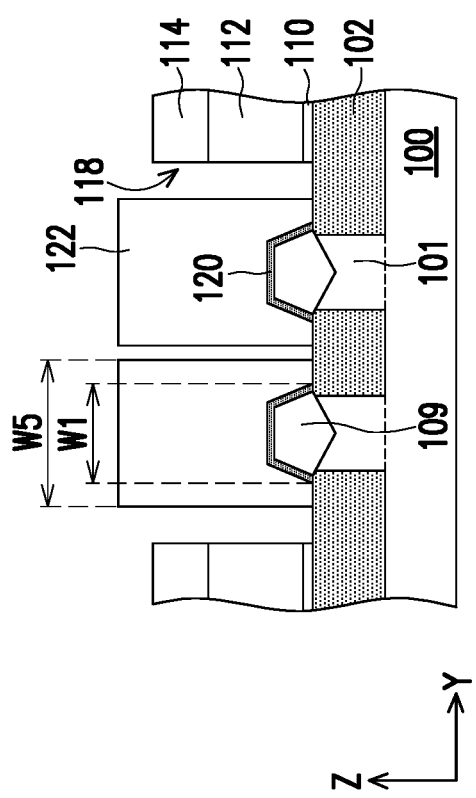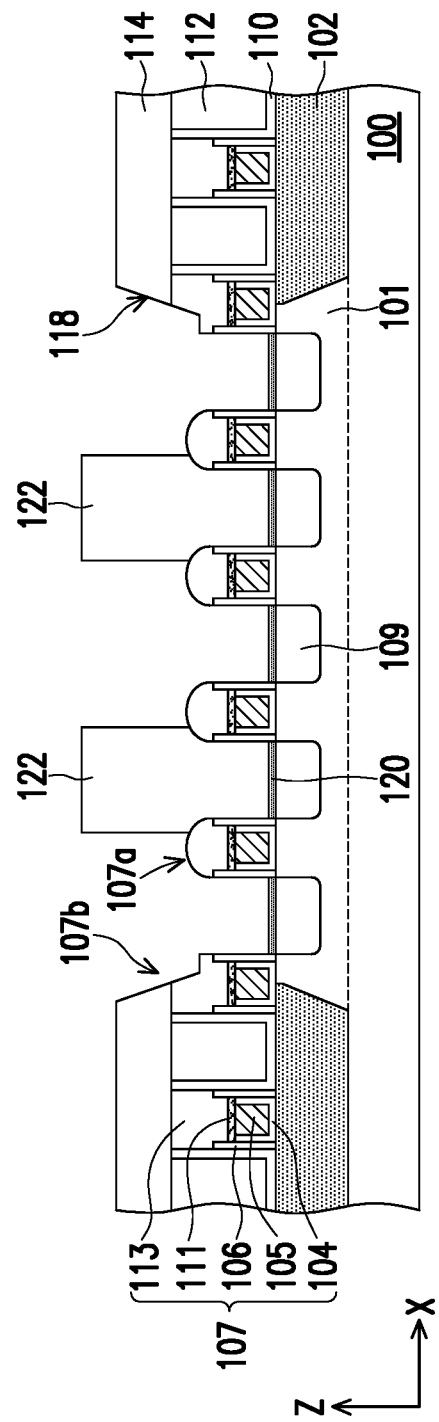
FIG. 11A
FIG. 11B

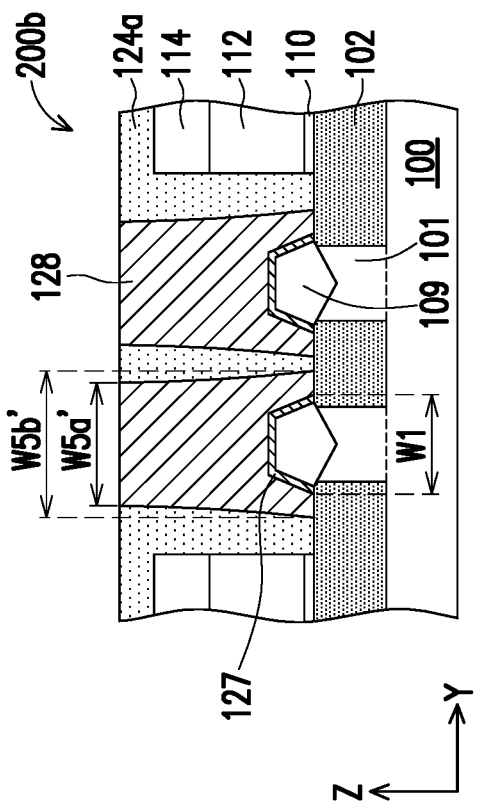
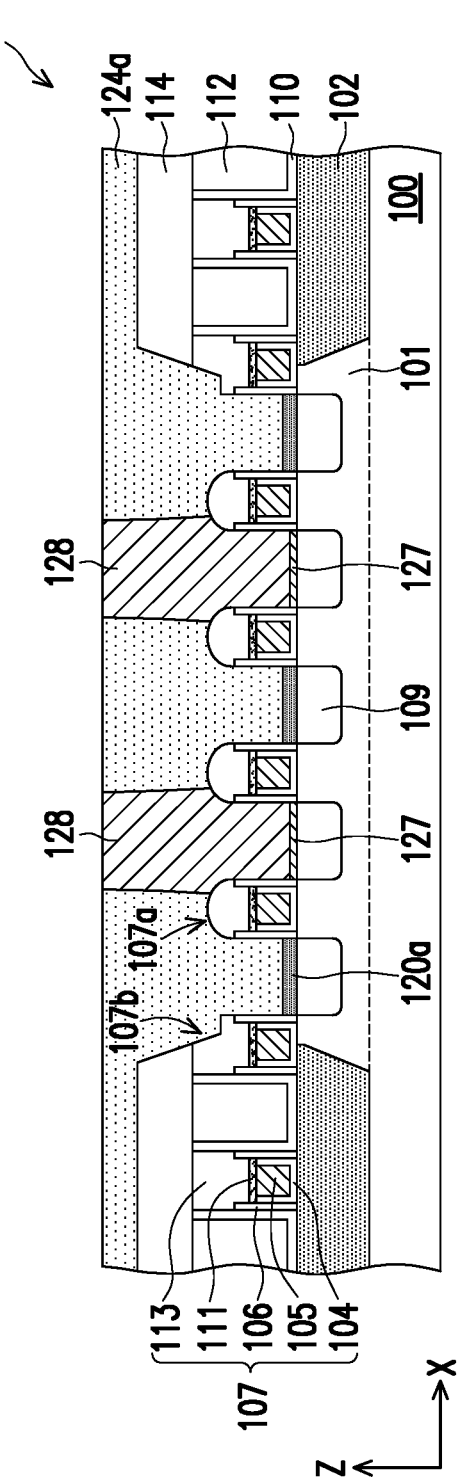
FIG. 14A
FIG. 14B

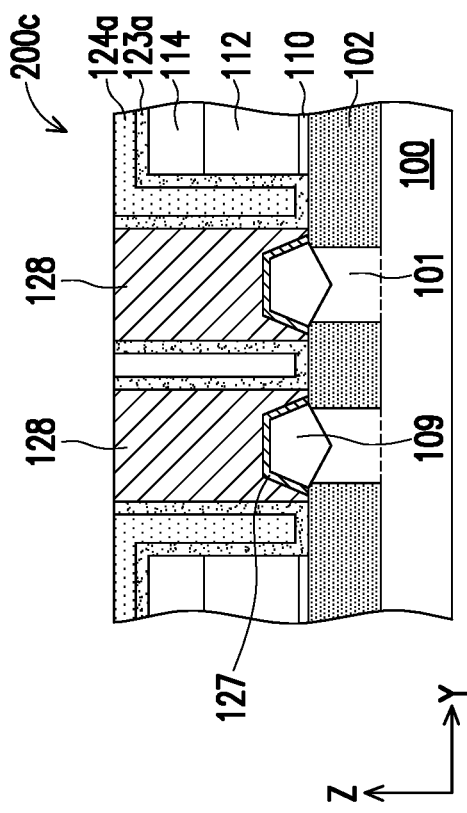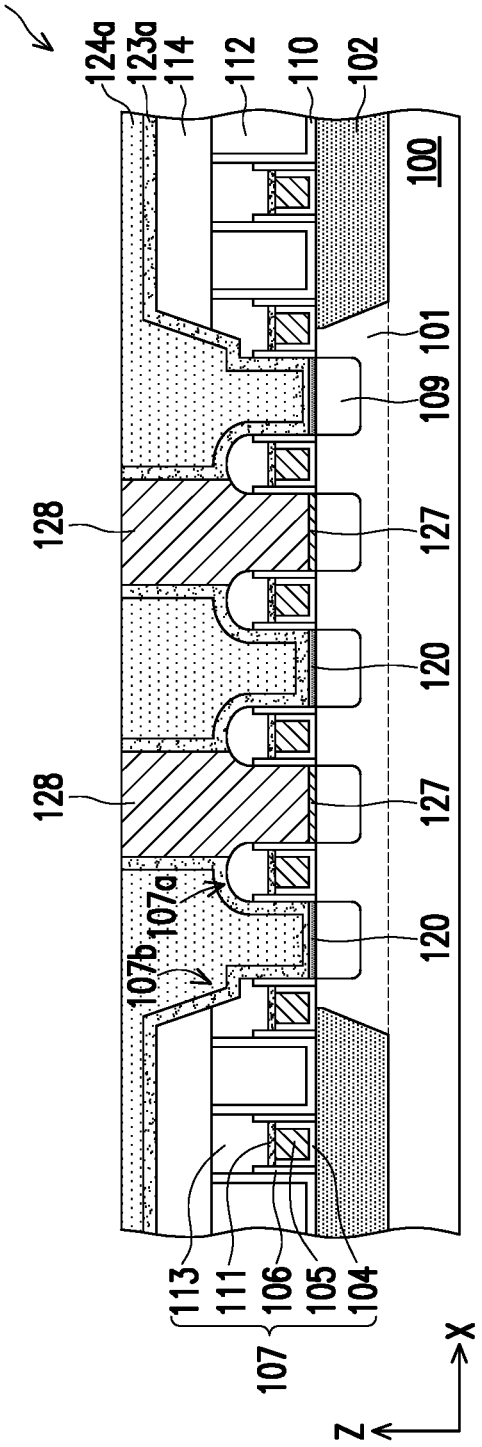
FIG. 19A
FIG. 19B

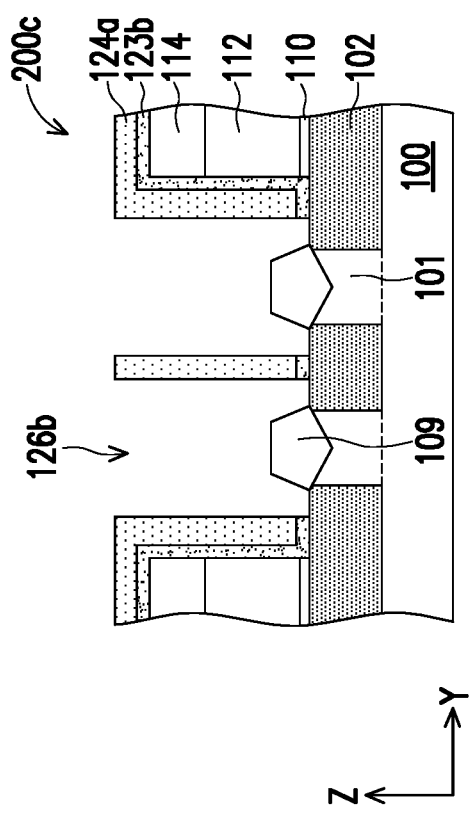
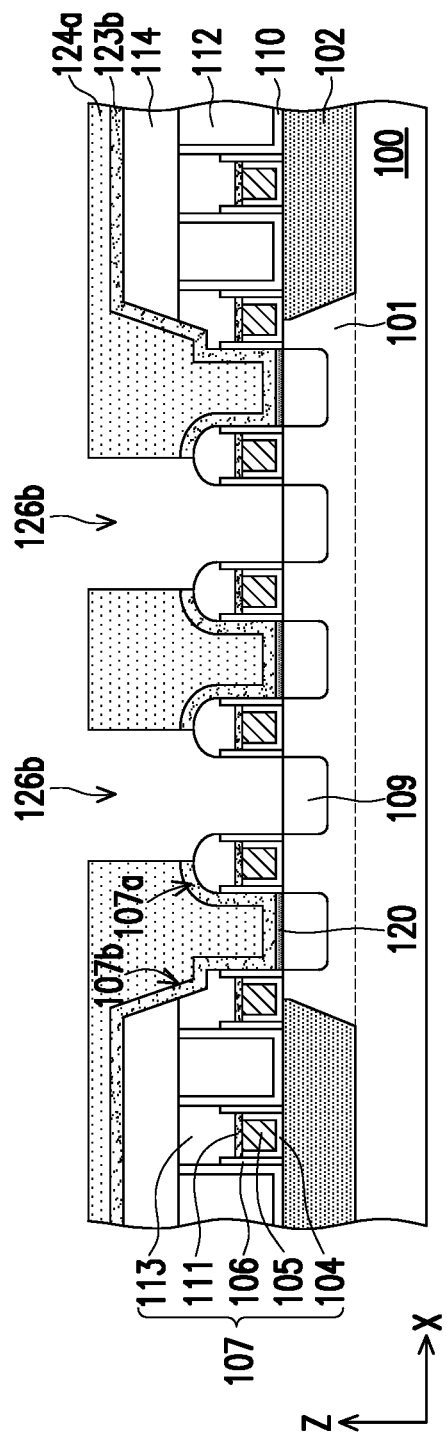
FIG. 21A
FIG. 21B

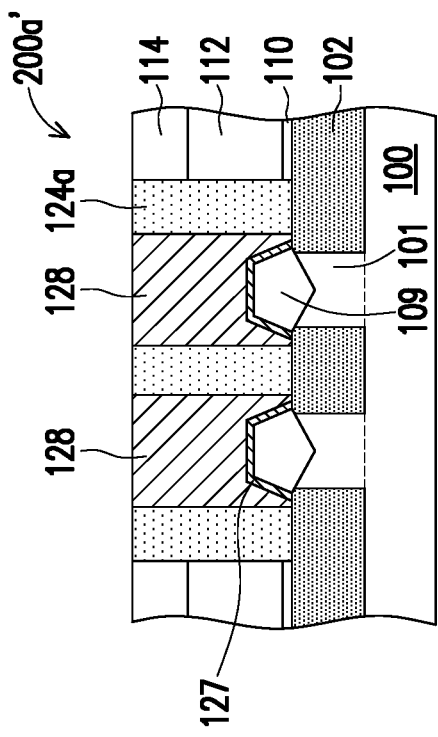
FIG. 23
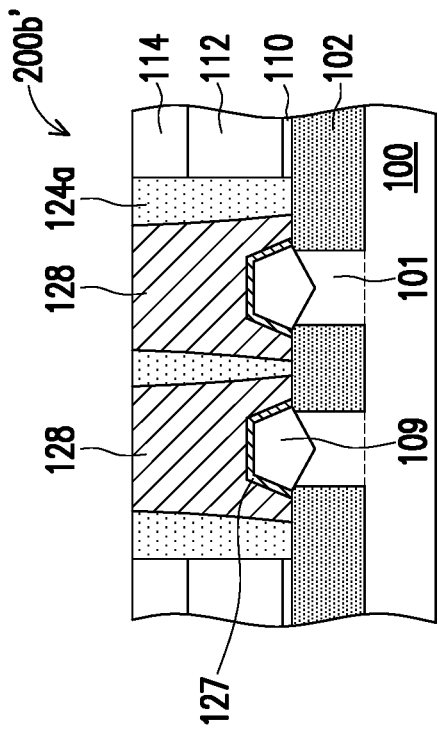
FIG. 24
FIG. 25
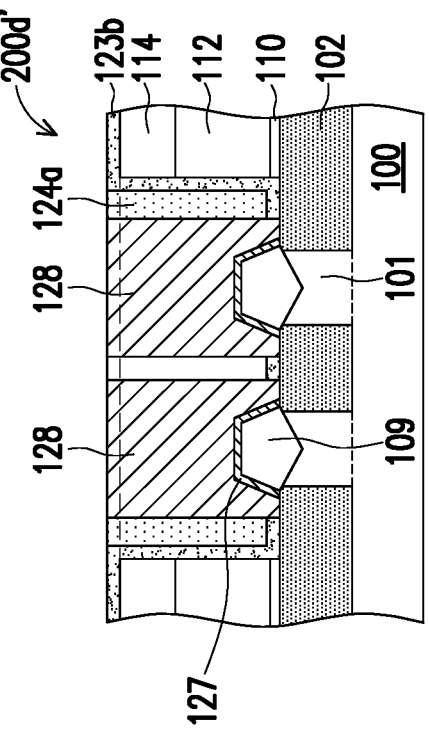
FIG. 26

SEMICONDUCTOR DEVICE, FinFET DEVICE AND METHODS OF FORMING THE SAME

CROSS-REFERENCE TO RELATED APPLICATION

This application is a divisional application of and claims the priority benefit of a prior application Ser. No. 17/685,401, filed on Mar. 3, 2022. The application Ser. No. 17/685,401 is a continuation application of and claims the priority benefit of a prior application Ser. No. 16/805,862, filed on Mar. 2, 2020. The prior application Ser. No. 16/805,862 claims the priority benefit of U.S. provisional application Ser. No. 62/906,745, filed on Sep. 27, 2019. The entirety of each of the above-mentioned patent applications is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of manufacturing ICs and, for these advances to be realized, similar developments in IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 2A to FIG. 10A and FIG. 2B and FIG. 10B are schematic cross-sectional views illustrating intermediate stages for forming a semiconductor device according to a first embodiment of the disclosure.

FIG. 11A to FIG. 14A and FIG. 11B and FIG. 14B are schematic cross-sectional views illustrating intermediate stages for forming a semiconductor device according to a second embodiment of the disclosure.

FIG. 15A to FIG. 19A and FIG. 15B and FIG. 19B are schematic cross-sectional views illustrating intermediate stages for forming a semiconductor device according to a third embodiment of the disclosure.

FIG. 20A to FIG. 22A and FIG. 20B and FIG. 22B are schematic cross-sectional views illustrating intermediate stages for forming a semiconductor device according to a fourth embodiment of the disclosure.

FIG. 23 to FIG. 26 are cross-sectional views illustrating semiconductor devices according to some other embodiment of the disclosure.

DETAILED DESCRIPTION

Figure 1A:
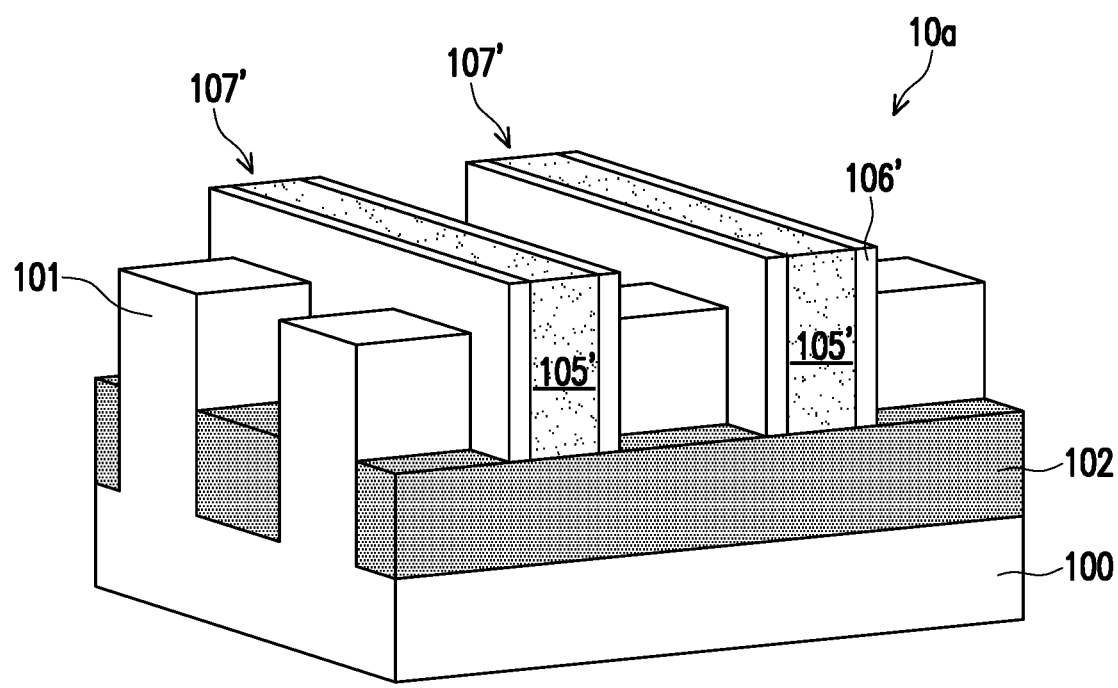
FIG. 1A and FIG. 1B illustrate three-dimensional views of semiconductor structures in intermediate stage for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments in which the semiconductor device is fin-type field effect transistor (FinFET) device, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial material layer is formed over a substrate and patterned using a photolithography process. Spacers are formed alongside the patterned sacrificial material layer using a self-aligned process. The sacrificial material layer is then removed, and the remaining spacers may then be used to pattern the fins.

A semiconductor device (e.g. FinFET device) and method of forming the same are provided in accordance with some embodiments of the disclosure. Various embodiments are directed to provide an increased contact area between the contact and corresponding source/drain (S/D) region (e.g. doped region or epitaxial region) of the semiconductor device. Throughout the various views and illustrative embodiments, like reference numbers are used to designate like elements. It is appreciated that although the formation of FinFET device is used as examples to explain the concept of the embodiments of the present disclosure, the embodiments of the present disclosure are readily applicable to other types of semiconductor device including a contact landing on doped region or epitaxial region (S/D region) and the forming method thereof. The other types of semiconductor device may include planar metal-oxide-semiconductor field effect transistor (planar MOSFET), gate-all-around (GAA) transistors, nanowire transistors, multiple-gate transistors, or the like, and the disclosure is not limited thereto.

Figure 1B:
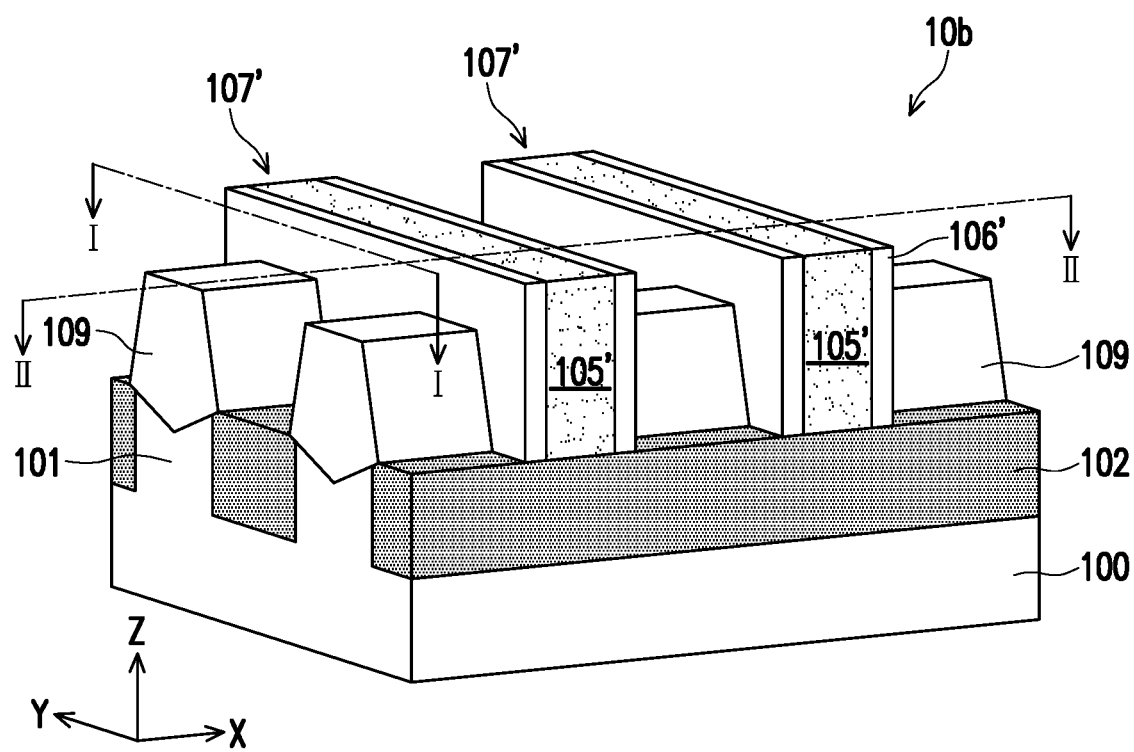

FIG. 1A and FIG. 1B illustrate three-dimensional views of semiconductor structures 10a and 10b in intermediate stage for forming a semiconductor device such as a FinFET device, in accordance with some embodiments.

Referring to FIG. 1A, the semiconductor structure 10a includes a substrate 100 having a plurality of fins 101. The substrate 100 is a semiconductor substrate, such as a bulk semiconductor substrate, a semiconductor-on-insulator (SOI) substrate, or the like, which may be doped (e.g., with a p-type or an n-type dopant) or undoped. The substrate 100 may be a semiconductor wafer, such as a silicon wafer. Other substrates, such as a multi-layered or gradient substrate may also be used. In some embodiments, the material of the substrate 100 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

Depending on the requirements of design, the substrate 10 may be a P-type substrate, an N-type substrate or a combination thereof and may have doped regions therein. The substrate 100 may be configured for an N-type FinFET device, a P-type FinFET device. In some embodiments, the substrate 100 for N-type FinFET device may include Si, SiP, SiC, SiPC, InP, GaAs, AlAs, InAs, InAlAs, InGaAs or combinations thereof. The substrate 100 for P-type FinFET device may include Si, SiGe, SiGeB, Ge, InSb, GaSb, InGaSb or combinations thereof.

The fins 101 protrude from a top surface of a body portion of the substrate 100. The substrate 100 has an isolation structure 102 formed thereon. The isolation structure 102 covers lower portions of the fins 101 and exposes upper portions of the fins 101. In some embodiments, the isolation structure 102 may include a shallow trench isolation (STI) structure, a cut poly structure or a combination thereof. The isolation structure 102 includes an insulation material, which may be an oxide, such as silicon oxide, a nitride such as silicon nitride, the like, or combinations thereof.

A plurality of gate structures 107' are formed on the substrate 100 and across the plurality of fins 101. In some embodiments, the gate structures 107' are dummy gate structures and may be replaced by metallic gate structures through a gate replacement process in subsequent steps. In some embodiments, the gate structure 107' may include a dummy gate electrode 105' and spacers 106' on sidewalls of the gate electrode 105'.

The dummy gate electrodes 105' may be formed by the following processes: in some embodiments, a dummy layer is formed on the substrate 100 covering the fins 101, and the isolation structure 102, and the dummy layer is then patterned by photolithography and etching processes. In some embodiments, the dummy layer may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. In some embodiments, the dummy layer may include a silicon-containing material such as polysilicon, amorphous silicon or combinations thereof. The dummy layer may be formed by a deposition process such as physical vapor deposition (PVD), chemical vapor deposition (CVD), or other suitable deposition process. In some embodiments, the fins 101 extends in the direction X, and the dummy gate electrodes 107' extend in the direction Y different from (e.g., perpendicular to) the direction X.

In some embodiments, a gate dielectric layer and/or an interfacial layer (not shown) may be disposed at least between the dummy electrode 105' and the fins 101 of the substrate 100. The gate dielectric layer and/or the interfacial layer may include silicon oxide, silicon nitride, silicon oxynitride or the like, or combinations thereof, and may be formed by thermal oxidation process, suitable deposition process such as CVD, ALD, or other suitable process known in the art, or combinations thereof.

Spacers 106' are respectively formed on sidewalls of the dummy gate electrodes 105'. In some embodiments, the spacer 106' includes $SiO_2$, SiN, SiCN, SiOCN, SiC, SiOC, SiON, or the like, or combinations thereof.

Referring to FIG. 1A and FIG. 1B, in some embodiments, after the dummy gate structures 107' are formed, S/D regions 109 are formed on opposite sides of the gate structures 107', and the portions of the fins 101' covered by the gate structures 107' and laterally sandwiched between the S/D regions 109 serves as the channel regions. The S/D regions 109 may be located in and/or on the fins 101 of the substrate 100. In some embodiments, the S/D regions 109 are strained layers (epitaxial layers) formed by epitaxial growing process such as selective epitaxial growing process. In some embodiments, a recessing process is performed on the fins 101, and recesses are formed in the fins 101 on sides of the gate structure 107', and the strained layers are formed by selectively growing epitaxy layers from the fins 101 exposed in the recesses. In some embodiments, the strained layers include silicon germanium (SiGe), SiGeB, Ge, InSb, GaSb, InGaSb or combinations thereof for a P-type FinFET device. In alternative embodiments, the strained layers include silicon carbon (SiC), silicon phosphate (SiP), SiCP, InP, GaAs, AlAs, InAs, InAlAs, InGaAs or a SiC/SiP multi-layer structure, or combinations thereof for an N-type FinFET device. In some embodiments, the strained layers may be optionally implanted with an N-type dopant or a P-type dopant as needed.

In some embodiments, the fin 101 is recessed to have a top surface lower than the top surface of the isolation structure 102, and a portion of the S/D region 109 may be embedded in the isolation structure 102. For example, the S/D region 109 includes an embedded portion and a protruding portion on the embedded portion. The embedded portion is embedded in the isolation structure 102, and the protruding portion protrudes from the top surface of the isolation structure 102. However, the disclosure is not limited thereto. In alternative embodiments, the fin 101 may be recessed with a top surface higher than the top surface of the isolation structure 102, and the S/D region 109 may be not embedded in isolation structure 102, and may completely protrudes above the top surface of the isolation structure 102.

It is noted that, the shape of the S/D region 109 shown in the figures is merely for illustration, and the disclosure is not limited thereto. The S/D region 109 may have any suitable shape according to product design and requirement.

FIG. 2A to FIG. 10A and FIG. 2B and FIG. 10B are schematic cross-sectional views illustrating intermediate stages for forming a semiconductor device following the process of forming S/D regions 109 shown in FIG. 1B in accordance with some embodiments. FIG. 2A to FIG. 10A illustrates the subsequent processes performed on the semiconductor device 10b taken along I-I line of FIG. 1B, while FIG. 2B to FIG. 10B illustrates the subsequent processes performed on the semiconductor device 10b taken along II-II line of FIG. 1B.

Figure 2A:
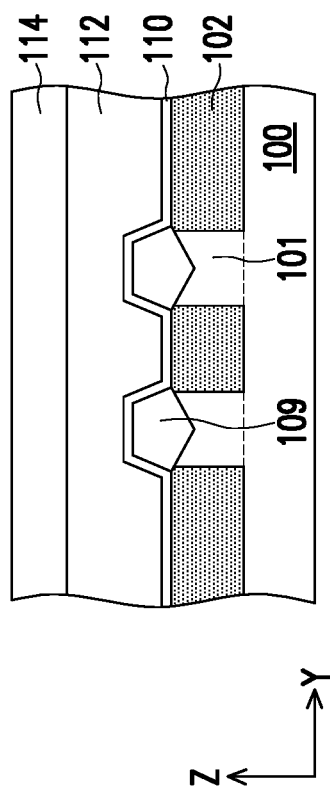
Figure 2B:
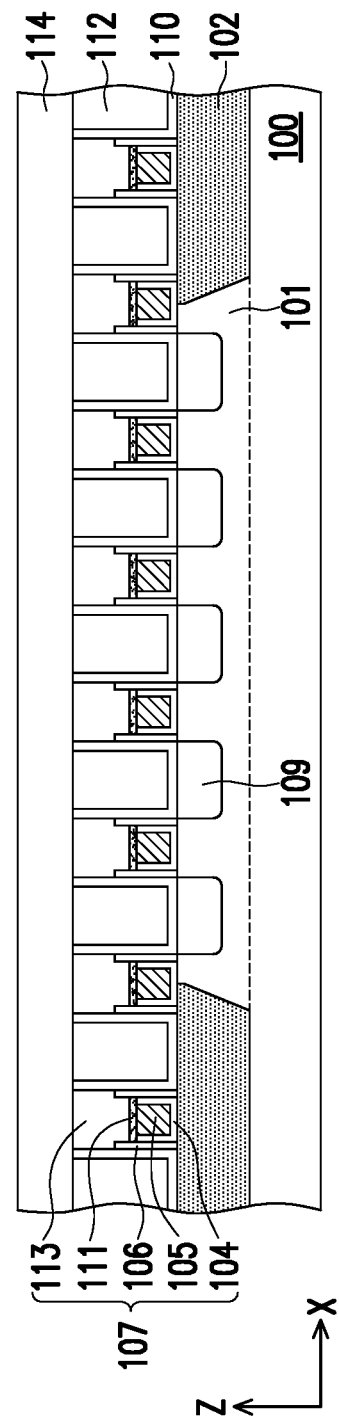

Referring to FIG. 1B, FIG. 2A and FIG. 2B, in some embodiments, after the S/D regions 109 are formed on sides of the gate structure 107', an etching stop layer 110 and a dielectric layer 112 are formed laterally aside the gate structure 107', and the gate structure 107' is replaced by a gate structure 107, and a dielectric layer 114 is formed on the gate structure 107 and the dielectric layer 112.

In some embodiments, the etching stop layer 110 may also be referred to as a contact etch stop layer (CESL), and is disposed between the substrate 100 (e.g. the S/D regions 109 and the isolation structure 102 of the substrate 100) and the dielectric layer 112 and between the gate structure 107 and the dielectric layer 112. In some embodiments, the etching stop layer 110 includes SiN, SiC, SiOC, SiON, SiCN, SiOCN, or the like, or combinations thereof. The etching stop layer 110 may be formed by CVD, plasma-enhanced CVD (PECVD), flowable CVD (FCVD), ALD or the like.

The dielectric layer 112 is formed laterally aside the gate structure 107, and may have a top surface substantially coplanar with the top surface of the gate structure 107. The dielectric layer 112 includes a material different from that of the etching stop layer 110. In some embodiments, the dielectric layer 112 may also be referred to as an interlayer dielectric layer (ILD), such as ILD0. In some embodiments, the dielectric layer 112 includes silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 112 may include low-k dielectric material with a dielectric constant lower than 4, extreme low-k (ELK) dielectric material with a dielectric constant lower than 2.5. In some embodiments, the low-k material includes a polymer based material, such as benzocyclobutene (BCB), FLARE®, or SILK®; or a silicon dioxide based material, such as hydrogen silsesquioxane (HSQ) or SiOF. The dielectric layer 112 may be a single layer structure or a multi-layer structure. The dielectric layer 112 may be formed by CVD, PECVD, FCVD, spin coating or the like.

In some embodiments, the etching stop layer 110 and the dielectric layer 112 may be formed by the following processes: after the S/D regions 109 are formed as shown in FIG. 1B, an etching stop material layer and a dielectric material layer are formed over the substrate 100 to cover the isolation structure 102, the S/D regions 109, and the gate structure 107'; thereafter, a planarization process is performed to remove excess portions of the etching stop material layer and the dielectric material layer over the top surfaces of the gate structures 107', so as to expose the gate structure 107', and the etching stop layer 110 and the dielectric layer 112 are thus formed laterally aside the gate structures 107'.

In some embodiments, after the formation of the etching stop layer 110 and the dielectric layer 112, the gate structure 107' is replaced by the gate structure 107 through a gate replacement process. In some embodiments, the gate structure 107 is a metallic gate structure and may include a gate dielectric layer 104, a gate electrode 105, a protection layer 111, spacers 106 and a helmet 113.

In some embodiments, the gate electrode 105 is a metallic gate electrode, and may include a work function metal layer and a metal filling layer on the work function metal layer. The work functional metal layer is configured to tune a work function of its corresponding FinFET to achieve a desired threshold voltage Vt. The work function metal layer may be an N-type work function metal layer or a P-type work function metal layer. In some embodiments, the P-type work function metal layer includes a metal with a sufficiently large effective work function and may include one or more of the following: TiN, WN, TaN, conductive metal oxide, and/or a suitable material, or combinations thereof. In alternative embodiments, the N-type work function metal layer includes a metal with sufficiently low effective work function and may comprise one or more of the following: tantalum (Ta), titanium aluminide (TiAl), titanium aluminum nitride (TiAlN), tantalum carbide (TaC), tantalum carbide nitride (TaCN), tantalum silicon nitride (TaSiN), titanium silicon nitride (TiSiN), other suitable metals, suitable conductive metal oxide, or combinations thereof. The metal filling layer may include copper, aluminum, tungsten, cobalt (Co), or any other suitable metallic material, or the like or combinations thereof. In some embodiments, the metal gate electrode 105 may further include a liner layer, an interface layer, a seed layer, an adhesion layer, a barrier layer, combinations thereof or the like.

In some embodiments, the gate dielectric layer 104 surrounds the sidewalls and bottom surface of the gate electrode 105. In alternative embodiments, the gate dielectric layer 104 may be disposed on bottom surface of the gate electrode 105 and between the gate electrode 105 and the substrate 100, without being disposed on sidewalls of the gate electrode 105. In some embodiments, the gate dielectric layer 104 may include silicon oxide, silicon nitride, silicon oxynitride, high-k dielectric materials, or combinations thereof. The high-k dielectric material may have a dielectric constant such as greater than about 4, or greater than about 7 or 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, combinations thereof, or a suitable material. In alternative embodiments, the gate dielectric layer 104 may optionally include a silicate such as HfSiO, LaSiO, AlSiO, combinations thereof, or a suitable material.

In some embodiments, a protection layer 111 is optionally formed on the gate electrode 105. In some embodiments, the protection layer 111 includes substantially fluorine-free tungsten (FFW) film. The FFW film may be formed by atomic layer deposition (ALD) or CVD using one or more non-fluorine based W precursors such as, but not limited to, tungsten pentachloride ($WCl_5$), tungsten hexachloride ($WCl_6$), or a combination thereof. In some embodiments, the protection layer 111 is formed to cover the gate electrode 105 and may further extend to cover the top surface of the gate dielectric layer 104 and contact the spacers 106. In alternative embodiments, the protection layer 111 merely covers the top surface of the metal gate electrodes 105. The sidewalls of the protection layer 111 may be aligned with the sidewalls of the gate electrode 105 or the sidewalls of the gate dielectric layer 104, and the disclosure is not limited thereto.

The spacers 106 are disposed on sidewalls of the gate electrode 105, and portions of the gate dielectric layer 104 may be laterally sandwiched between the gate electrode 105 and the spacers 106. The spacers 106 may have a height less than the spacers 106' (FIG. 1B), but the disclosure is not limited thereto. In some embodiments, the top surfaces of the spacers 106 are higher than the top surface of the protection layer 111 on the gate electrode 105.

In some embodiments, the helmet 113 is formed over the gate electrode 105 to cover the protection layer 111 and the spacers 106. The helmet 113 includes a dielectric material, such as nitride (e.g. silicon nitride), oxide (e.g. silicon oxide), silicon oxycarbide, or the like, or combinations thereof, and the disclosure is not limited thereto.

In some embodiments, the formation of the gate structure 107 includes a gate replacement process. For example, the dummy gate electrode 105' and/or the dummy dielectric layer/interfacial layer of the dummy gate structure 107' (FIG. 1B) are removed, and a gate trench defined by the spacers 106' is formed. A gate dielectric material layer and gate electrode materials are then formed within the gate trench. Thereafter, recessing processes are performed to remove portions of the gate dielectric material layer and the gate electrode materials, and the gate dielectric layer 104 and gate electrode 105 are thus formed. In some embodiments, portions of the spacers 106' may also be removed to form the spacers 106 with a smaller height. The protection layer 111 is formed on the gate electrode 105, and the helmet 113 is then formed to cover the protection layer 111 and the spacers 106. In some embodiments, the top surface of the helmet 113 is substantially coplanar with the top surface of the dielectric layer 112.

Thereafter, the dielectric layer 114 is formed on the gate structure 107 and the dielectric layer 112. The material of dielectric layer 114 may be selected from the same candidate materials as the dielectric layer 112, and may be formed by a similar process of the dielectric layer 112. The dielectric layer 114 may also be referred to as an interlayer dielectric layer (ILD), such as ILD1. In some embodiments, both of the dielectric layer 112 and the dielectric layer 114 include silicon oxide formed by FCVD process. In some embodiments, an etching stop layer (not shown) may further be formed on the gate structure 107 and dielectric layer 112 before forming the dielectric layer 114.

Figure 3A:
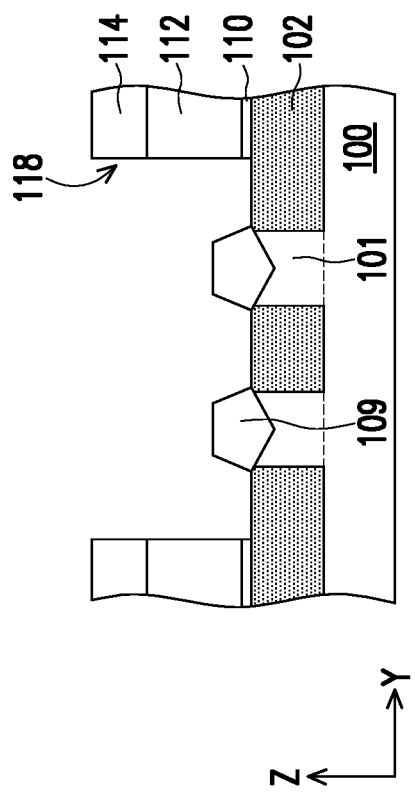
Figure 3B:
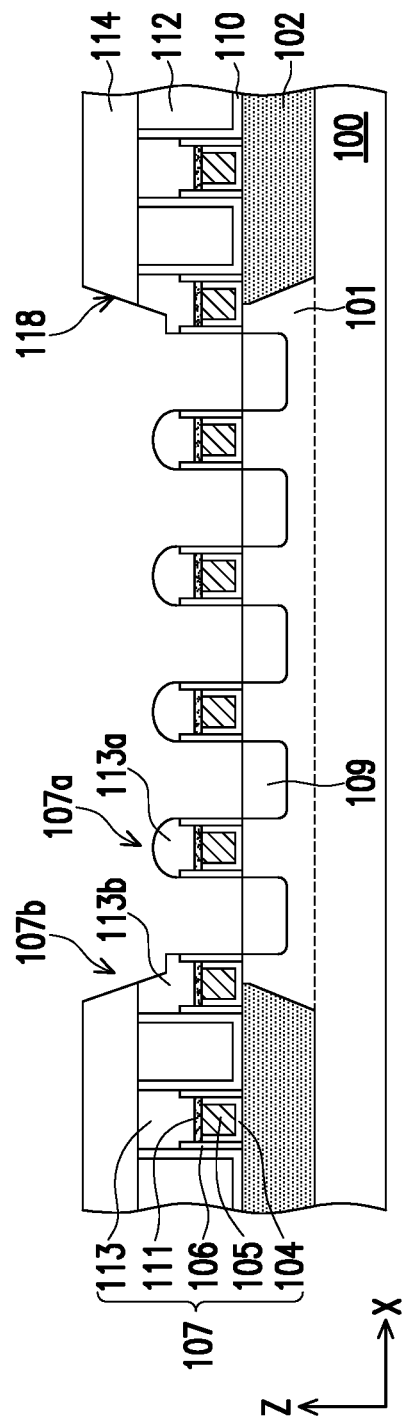

Referring to FIG. 3A and FIG. 3B, in some embodiments, a removal process is performed to remove portions of the dielectric layers 114 and 112 and the etch stop layer 110, so as to form an opening 118. In some embodiments, the dielectric layers 114 and 112 in a contact region within which contacts are to be formed and regions adjacent to the contact region are removed (e.g. completely removed). The opening 118 may expose (e.g. completely expose) the S/D regions 109 and isolation structure 102 adjacent thereto, and some of the gate structures. In detail, the surfaces of the S/D regions 109 protruding over the isolation structure 102, a portion of the top surface of the isolation structure 102 adjacent to the exposed S/D regions 109, top surfaces and sidewalls of some of the gate structures are exposed by the opening 118. In some embodiments, the removal process includes one or more etching processes. In some embodiments, the helmets 113 of the gate structures 107 in the said region may also be partially removed by the removal process, and gate structures 107a/107b having helmets 113a/113b are formed. The gate structures 107a may be completely exposed by the opening 118, and the helmets 113a may have rounding surfaces, for example. The gate structures 107b may be partially exposed by the opening 118 and partially covered by the dielectric layer 114, and the helmets 113b may have irregular surface. However, the disclosure is not limited thereto. In alternative embodiments, the helmets of the gate structures are not damaged by the removal process.

Figure 4A:
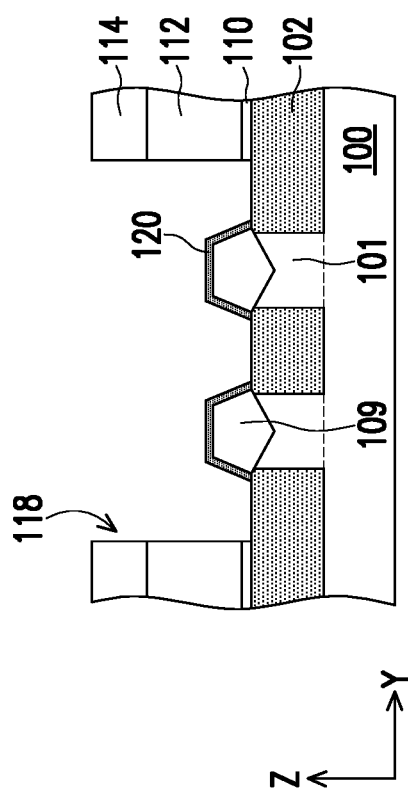
Figure 4B:
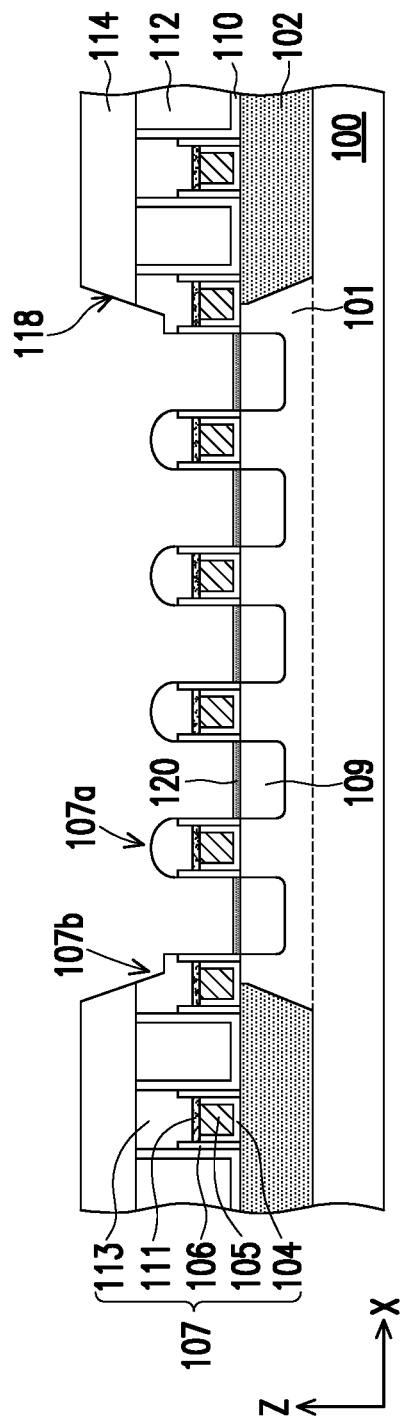

Referring to FIG. 4A and FIG. 4B, in some embodiments, the surfaces of the S/D regions 109 exposed by the opening 118 may be oxidized (e.g. by the oxygen present in the air or process chamber), and a native oxide layer 120 may be formed on the surfaces of the S/D regions 109. The native oxide layer 120 may include silicon oxide, for example. However, the disclosure is not limited thereto. In some other embodiments, the S/D regions 109 are not oxidized and free of native oxide layer formed thereon.

Figure 5A:
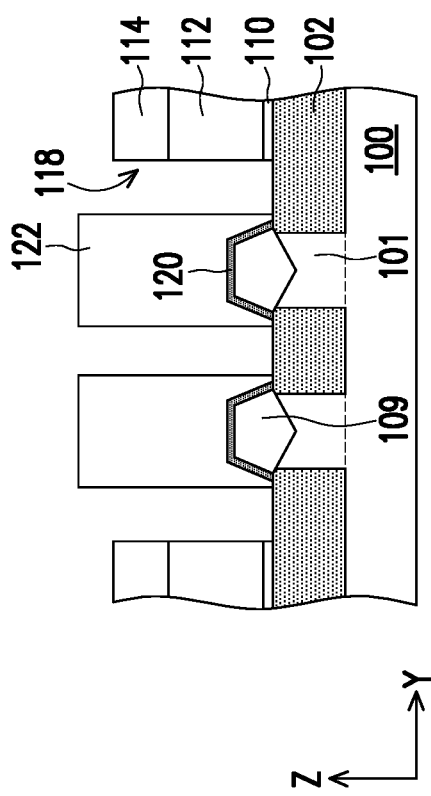
Figure 5B:
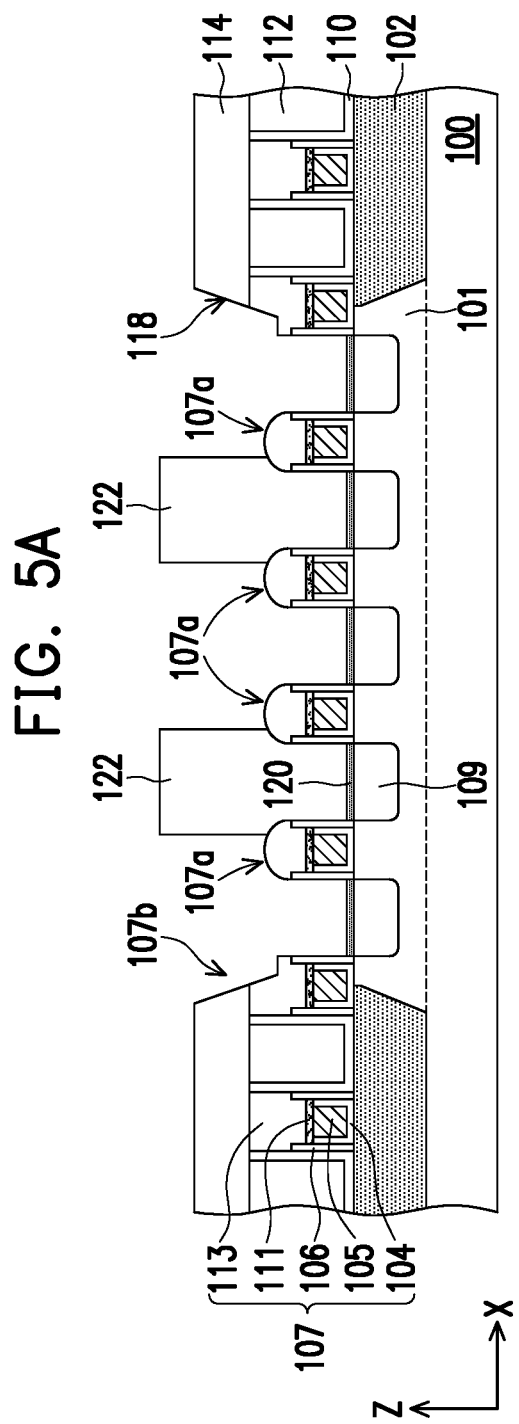

Referring to FIG. 5A and FIG. 5B, thereafter, a plurality of masks 122 are formed on the S/D regions 109 exposed by the opening 118. The masks 122 are disposed at the intended locations for the subsequently formed contacts. In some embodiments, the masks 122 may also be referred to as dummy contacts or sacrificial contacts. In some embodiments, each of the mask 122 covers (e.g. completely covers) the surface of the corresponding S/D region 109 previously exposed by the opening 118 and the native oxide layer 120 (if any) on the S/D region 109. The mask 122 is disposed laterally aside the gate structure 107a or laterally between two adjacent gate structures 107a in some embodiments. The masks 122 may cover and contact the sidewalls of the gate structures 107a. In some embodiments, the masks 122 may further cover and contact portions of the top surfaces of the gate structures 107a. In some embodiments, the top surfaces of the masks 122 may be higher than the top surface of the dielectric layer 114, but the disclosure is not limited thereto. In alternative embodiments, the top surfaces of the masks 122 may be substantially coplanar with the top surface of the dielectric layer 114.

The masks 122 may be formed by any suitable material. In some embodiments, the masks 122 are patterned masks formed by the following process: a mask material layer is formed over the substrate 100 to fill the opening 118 and may cover the top surface of the dielectric layer 114, thereafter the mask material layer is patterned to form the masks 122. The patterning of the mask material layer may include photolithograph process and/or etch processes. In some embodiments, the mask material layer is a tri-layer structure including a bottom layer, a middle layer and an upper layer. The bottom layer may include an organic dielectric material, such as a polymer material. For example, the bottom layer may include T19 and T136. The middle layer is formed on the bottom layer and may include an oxide layer such as silicon oxide (SiOx). The upper layer is formed on the middle layer and may include a photoresist material. The patterning of the mask material layer may be performed as follows: the upper layer (e.g. photoresist) is patterned by a photolithograph process using photomask having a pattern corresponding to the masks 122, so as to form a patterned upper layer having the pattern corresponding to the masks 122. Thereafter, the middle layer is patterned by using the patterned upper layer as a pattern mask, such that the pattern transferred into the middle layer; and the bottom layer is then patterned by using the patterned upper layer and/or the patterned middle layer as a pattern mask, such that the pattern transferred into the bottom layer. For example, the portions of the middle layer and the bottom layer not covered by the patterned upper layer are removed by etching process(es) using the patterned upper layer/middle layer as an etching mask. In some embodiments, during the etching of the bottom layer and/or the middle layer, portions or all of the upper layer may be consumed. In some embodiments, the upper layer may be completely consumed, and the underlying middle layer may be partially or completely consumed during the etching of the bottom layer. In some embodiments, after the patterning process is completed, merely the patterned bottom layer is remained serving as the masks 122. In alternative embodiments, the middle layer is not completely consumed, and the patterned bottom layer and the patterned middle layer constitute the masks 122. It should be understood that, the above-described material and forming method of the mask 122 is merely for illustration, and the disclosure is not limited thereto. Other suitable material and forming process may also be used for forming the mask 122.

Figure 6A:
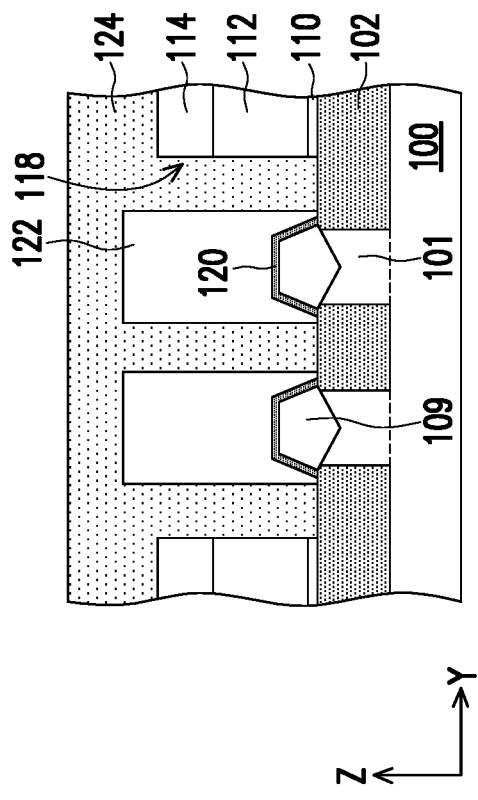
Figure 6B:
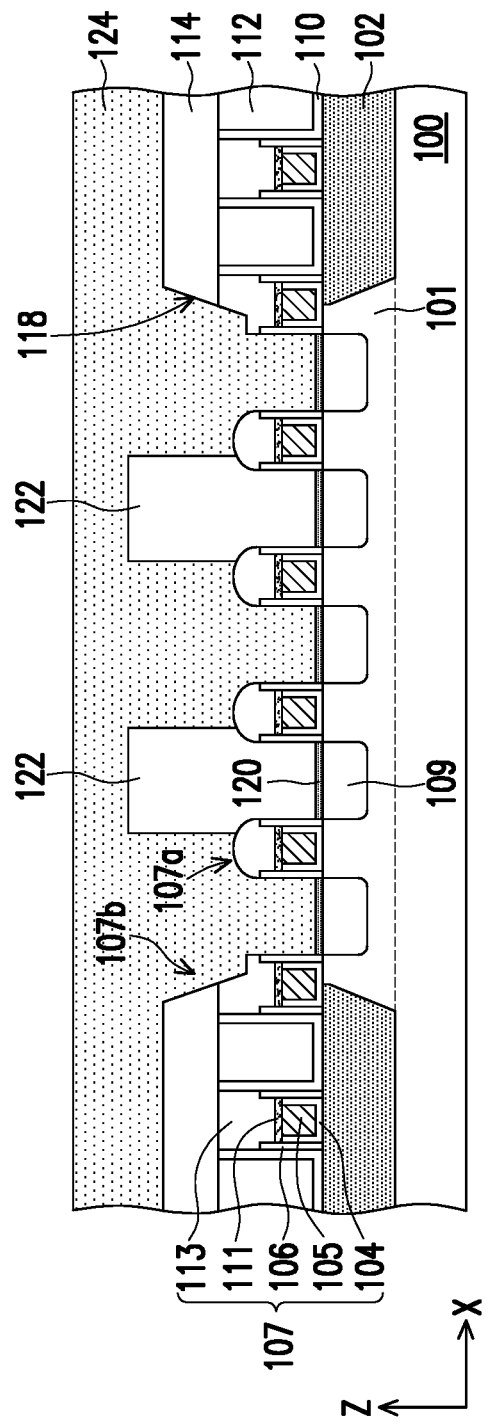

Referring to FIG. 6A and FIG. 6B, a dielectric material layer (or referred to as an additional dielectric material layer) 124 is formed over the substrate 100. In some embodiments, the dielectric material layer 124 fills the opening 118 not filled by the masks 122, and may cover the top surfaces of the dielectric layer 114 and the top surfaces of the masks 122. In some embodiments, the material and forming method of the dielectric material layer 124 may be the same as or different from those of the dielectric layer 114 or 112. In some embodiments, the dielectric material layer 124 includes a material similar to that of the dielectric layer 114/112 and may be formed by a process different from the forming process of the dielectric layer 114/112. For example, the dielectric material layer 124 may include $SiO_x$, SiCO, SiON, $SiO_xH_y$, or the like or combinations thereof. In some embodiments, the dielectric material layer 124 may be formed by a low temperature deposition process or a medium temperature process or an atomic layer deposition (ALD) process where the process temperature is relatively low. In some embodiments, the deposition temperature of the dielectric material layer 124 is lower than the deposition temperature of the ILDs 112/114. In some embodiments, the deposition temperature of the dielectric material layer 124 is lower than 200° C., for example.

In some embodiments, the dielectric material layer 124 includes a medium temperature oxide (MTO) formed by a medium temperature deposition process and/or a low temperature oxide (LTO) formed by a low temperature deposition process. For example, the MTO may include silicon oxide ($SiO_2$) or the like, and the medium temperature deposition process may be performed at a temperature in a range of 120° C. to 190° C., such as 150° C. The LTO may include $SiO_xH_y$, or the like, and the low temperature deposition process may be performed at a temperature in a range of 50° C. to 100° C., such as 75° C. In alternative embodiments, the dielectric material layer 124 is formed by an ALD process where the deposition temperature ranges from 50° C. to 300° C. In some embodiments, the dielectric material layer 124 is formed at such low or medium temperature, so as to protect the masks 122 from high temperature. However, the disclosure is not limited thereto. In some other embodiments, the material of the mask 122 may be resistant to relative high temperature, and the forming method of the dielectric material layer 124 is not limited to above-described low temperature or medium temperature process, and any suitable deposition process known in the art may also be used. In some embodiments, the dielectric material layer 124 is formed using a silicon-containing precursor such as $SiH_2(NC_2H_5)_2$, and an oxidizing plasma such as oxygen plasma. However, the disclosure is not limited thereto.

Referring to FIG. 6A and FIG. 6B to FIG. 7A and FIG. 7B, a portion of the dielectric material layer 124 are removed to expose the masks 122, and a dielectric layer (or referred to as an additional dielectric layer) 124a is formed. In some embodiments, an etching back process is performed to remove the dielectric material layer 124 over the top surfaces of the masks 122, and the remained dielectric layer 124a has a top surface substantially coplanar with the top surface of the mask 122. In alternative embodiments, a planarization process such as a CMP process may be formed to remove the portion of the dielectric material layer 124 over the top surfaces of the masks 122, the planarization process may be stopped until the top surfaces of the masks 122 are exposed, and the dielectric layer 124a may cover the top surfaces of the dielectric layer 114. In some other embodiments (not shown), the planarization process may further remove portions of the masks 122 and a portion of the dielectric material layer 124 laterally aside the masks 122, and may be stopped until the top surface of the dielectric layer 114 is exposed, and the remained dielectric layer 124a may have a top surface substantially coplanar with the top surface of the dielectric layer 114 and the top surfaces of the masks 122.

Referring to FIG. 8A and FIG. 8B, thereafter, the dummy contacts 122 are removed, such that contact holes 126 are formed at the location previously occupied by the dummy contacts 122, and the S/D regions 109 are exposed. In some embodiments in which the dummy contacts 122 are formed of above-described bottom layer, the dummy contacts 122 may be removed by an ashing process, but the disclosure is not limited thereto. In alternative embodiments, the dummy contacts 122 may be removed by a stripping process or an etching process.

Referring to FIG. 8A and FIG. 8B to FIG. 9A and FIG. 9B, in some embodiments in which the surfaces of the S/D regions 109 are oxidized and have native oxide layer 120 formed thereon, a clean process is then performed to remove the native oxide layer 120. The clean process may include a wet cleaning process, an etching process, such as anisotropic etching process. The etchant used for the etching process may include hydrofluoric acid, or the like.

Referring to FIG. 9A and FIG. 9B, after the clean process, the S/D regions 109 are exposed by the contact hole 126 for contact landing. In some embodiments, the S/D region 109 protruding above the top surface of the isolation structure 102 is completely exposed by the contact hole 126. In some embodiments, a portion of the top surface of the isolation structure 102 adjacent to the S/D regions 109 is also exposed by the contact hole 126, but the disclosure is not limited thereto. In some embodiments, sidewalls of some of the gate structures 107a are exposed by the contact holes 126. In some embodiments, portions of the top surfaces of the some of the gate structures 107a may further be exposed by the contact holes 126.

Figure 10A:
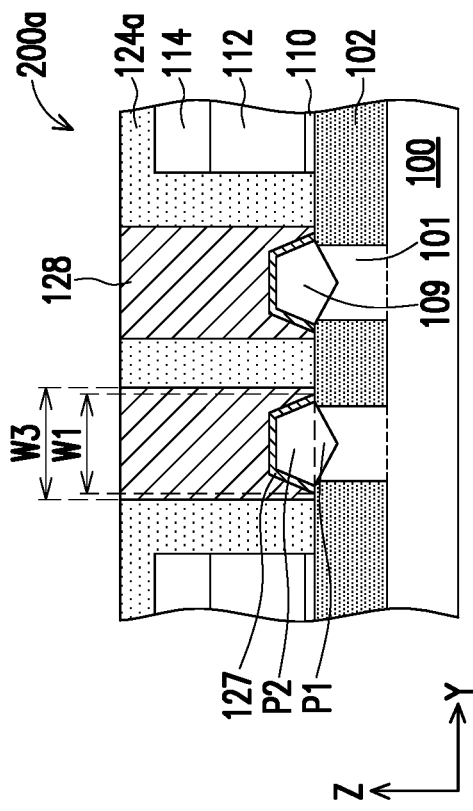
Figure 10B:
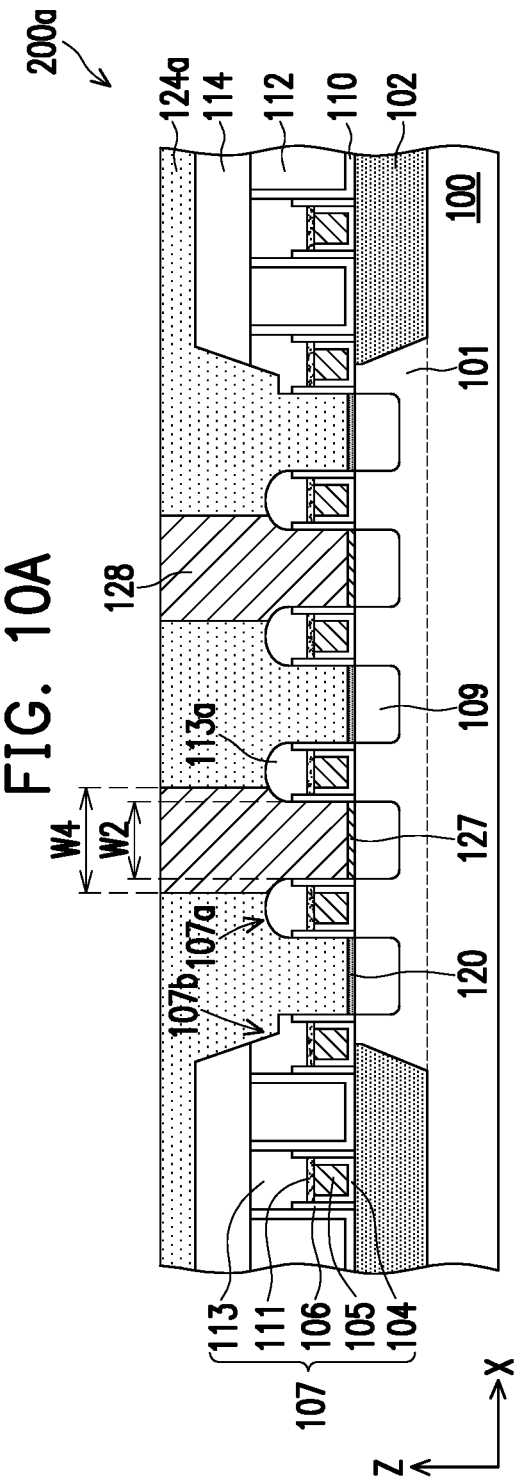

Referring to FIG. 10A and FIG. 10B, a plurality of contacts 128 are formed in the contact holes 126 (shown in FIG. 9A/9B) to connect to the S/D regions 109. In some embodiments, the contact 128 includes a barrier layer and a conductive post on the barrier layer (not specifically shown). The barrier layer may include titanium, tantalum, titanium nitride, tantalum nitride, manganese nitride or a combination thereof. The conductive post may include metal, such as tungsten (W), copper (Cu), Co, Ru, Ir, Ni, Os, Rh, Al, Mo, alloys thereof, combinations thereof or any metal material with suitable resistance and gap-fill capability.

In some embodiments, the contacts 128 may be formed by the following processes: a barrier material layer and a metal material layer are formed over the substrate 100 by sputtering, CVD, PVD, electrochemical plating (ECP), electrodeposition (ELD), ALD, or the like or combinations thereof. The barrier material layer and the metal material layer fill in the contact holes 126 and cover the top surface of the dielectric layer 124a. Thereafter, a planarization process such as CMP is performed to remove excess portions of the metal material layer and the barrier material layer over the dielectric layer 124a, so as to expose the top surface of the dielectric layer 124a, thereby forming the contacts 128 in the contact holes 126.

In some embodiments, prior to the formation of the contacts 128, a silicide layer 127 may be formed on the S/D region 109. In some embodiments, the silicide layer 109 include nickel silicide (NiSi), cobalt silicide (CoSi), titanium silicide (TiSi), tungsten silicide (WSi), molybdenum silicide (MoSi), platinum silicide (PtSi), palladium silicide (PdSi), CoSi, NiCoSi, NiPtSi, Ir, PtIrSi, ErSi, YbSi, PdSi, RhSi, or NbSi, or combinations thereof.

In some embodiments, the silicide layer 109 is formed by performing a self-aligned silicide (salicide) process including following steps. A metal layer is formed to at least cover the S/D region 109. The material of the metal layer may include Ti, Co, Ni, NiCo, Pt, Ni(Pt), Ir, Pt(Ir), Er, Yb, Pd, Rh, Nb, TiSiN, or combinations thereof. Thereafter, an annealing process is carried out such that the metal layer is reacted with the S/D regions 109, so as to form the silicide layer 127. The unreacted metal layer is then removed. In the illustrated embodiment, the silicide layer 127 is formed after the contact hole 126 is formed, but the disclosure is not limited thereto. In alternative embodiments, the silicide layer 127 may be formed before forming the etching stop layer 110.

Referring to FIG. 10A and FIG. 10B, a semiconductor device 200a is thus formed. In some embodiments, the semiconductor device 200a is a FinFET device and includes the substrate 100 having a plurality of fins 101 and isolation structure 102 aside the fins 101, the gate structures 107, 107a and 107b, S/D regions 109, etching stop layer 110, dielectric layers (i.e. ILDs) 112 and 114, additional dielectric layer 124a and contacts 128.

The gate structure 107 is disposed on the substrate 100 and between the S/D regions 109. In other words, the S/D regions 109 are disposed in and/or on the fins 101 of the substrate 100 and on opposite sides of the gate structure 107. At least a portion of the S/D region 109 protrudes above the isolation structure 102. In some embodiments, the S/D region 109 includes an embedded portion P1 and a protruding portion P2 on the embedded portion P1. The embedded portion P1 is embedded in the isolation structure 102, and the protruding portion P2 protrudes from the top surface of the isolation structure 102.

The etching stop layer 110 and the dielectric layer 112 are located on the substrate 100 and laterally aside the gate structures 107, 107a and 107b, the dielectric layer 114 is located on and covers the top surfaces of the gate structures 107 and 107b, the etching stop layer 110 and the dielectric layer 112.

The additional dielectric layer 124a is located on the substrate 100 and overlays the gate structures 107, 107a and 107b, the etching stop layer 110, the dielectric layers 112 and 114. In some embodiments, the additional dielectric layer 124a may have a top surface higher than the top surface of the dielectric layer 114, but the disclosure is not limited thereto. Interfaces are existed between the additional dielectric layer 124a and the ILD 112/114. In some embodiments, the gate structures 107a are covered by the additional dielectric layer 124a and separated from the ILDs 112/114 and the etching stop layer 110, the gate structures 107b are partially covered by the additional dielectric layer 124a and partially covered by the ILD 114.

The contacts 128 penetrate through the additional dielectric layer 124a to connect to the S/D regions 109. In some embodiments, the contact 128 warps around the S/D region 109 and may cover the top surface and sidewalls of the S/D region 109, a portion of the contact 128 may be laterally aside the S/D region 109. The protruding portions P2 of the S/D region 109 (i.e. the portion of the S/D region 109 not covered by the isolation structure or fins of the substrate 100 or the gate structure 107a) may be completely covered by the contact 128. In other words, the landing area of the contact 128 on corresponding S/D region 109 is substantially equal to the area of the surface of the protruding portion P2 of the S/D region 109. As shown in FIGS. 10A, in some embodiments, the contact 128 may further be in contact with a portion of the top surface of the isolation structure 102 adjacent to the corresponding S/D region 109. The sidewalls of the contact 128 are covered by and in contact with the additional dielectric layer 124a and laterally spaced apart from the ILDs 112/114 and the etching stop layer 110 by the additional dielectric layer 124a therebetween.

In some embodiments, as shown in FIG. 10B, the contact 128 is located laterally aside the gate structure 107a and landing on the corresponding S/D region 109 of the gate structure 107a, the contact 128 may be in contact with sidewalls of gate structure 107a and may further extend to cover and contact a top surface of the gate structure 107a. For example, the sidewalls of the spacer 106 and/or a portion of the surface of the helmet 113a of the gate structure 107a may be in contact with the contact 128. In some embodiments, one of the S/D regions 109 may serve as a common S/D region 109 of two adjacent gate structures 107, and the contact 128 is landing on the common S/D region 109 and laterally between the two adjacent gate structures 107. In such embodiments, the contact 128 is in contact with the sidewalls of the two adjacent gate structures 107a and may further cover portions of the top surfaces of the two adjacent gate structures 107a. However, the disclosure is not limited thereto.

In other words, the additional dielectric layer 124a is located at least laterally between the contact 128 and the ILDs 112/114, between the adjacent contacts 128, between the gate structures 107a and the ILDs 112/114. In some embodiments, the top surface of the additional dielectric layer 124a is substantially coplanar with the top surfaces of the contacts 128 and higher than the top surface of the ILD 114, but the disclosure is not limited thereto. In alternative embodiments, as shown in FIG. 23, in a semiconductor device 200a', the additional dielectric layer 124a may be laterally aside the ILDs 112/114 without covering the top surface of the dielectric layer 114, and the top surface of the additional dielectric layer 124 may be substantially coplanar with the top surfaces of the contacts 128 and the top surface of the dielectric layer 114.

In some embodiments, the additional dielectric layer 124a has properties different from those of the ILDs 112 and 114 due to different forming processes. For example, the density and breakdown voltage of the additional dielectric layer 124a may be different from those of the ILDs 112 and 114. In some embodiments in which the additional dielectric layer 124a includes a MTO material, the density of the additional dielectric layer 124a is larger than the density of the ILD 112/114, and the breakdown voltage (VBD) of the additional dielectric layer 124a may be larger than the breakdown voltage of the ILD 112/114. In alternative embodiments in which the additional dielectric layer 124a includes a LTO material, the density of the additional dielectric layer 124a is less than the density of the ILD 112/114, and the breakdown voltage of the additional dielectric layer 124a may be less than the breakdown voltage of the ILD 112/114.

Still referring to FIG. 10A and FIG. 10B, in some embodiments, the first width W3 of the contact 128 is equal to or larger than the first width W1 of the S/D region 109 (with the silicide layer 127), the second width W4 of the contact 128 is equal to or larger than the second width W2 of the S/D region 109 (with the silicide layer 127). Herein, the "first width" refers to the width along the direction Y, and the "the second width" refers to the width along the direction X perpendicular to the direction Y. The first width W1 and second width W2 of the S/D region 109 refers to the largest widths of the portion of the S/D region 109 protruding over the isolation structure 102.

FIG. 11A and FIG. 11B to FIG. 14A to FIG. 14B are schematic cross-sectional views illustrating intermediate stages for forming a semiconductor device according to a second embodiment of the disclosure.

Referring to FIG. 11A and FIG. 11B, the structure shown in FIG. 11A and FIG. 11B is similar to the structure shown in FIG. 5A and FIG. 5B and formed by the processes substantially the same as those described in FIG. 1A and FIG. 1B to FIG. 5A and FIG. 5B. As shown in FIG. 11A and FIG. 11B, an opening 118 is formed in the dielectric layers 112/114 and the etching stop layer 110, and dummy contacts 122 are formed on the S/D regions 109. In some embodiments, the dummy contact 122 is formed to have a suitable width. In some embodiments, the dummy contact 122 has a substantially uniform width W5 which is larger than the width W1 of the S/D region 109. For example, the width W5 may range from 20 nm to 50 nm, the width W1 may range from 20 nm to 30 nm, the width difference (W5−W1) between the width W5 and the width W1 may range from 0 to 20 nm, or 0 to 30 nm (not including 0). The above-described width ranges are merely for illustration, and the disclosure is not limited thereto. In some embodiments, the width W5 of the dummy contact 122 is configured to be larger than the width of subsequently formed contact hole/contact.

Referring to FIG. 11A and FIG. 11B to FIG. 12A and FIG. 12B, in some embodiments, after the dummy contact 122 is formed, the dielectric material layer 124 is formed over the substrate 100 to fill into the opening 118 and cover the top surfaces of the dummy contacts 122 and the dielectric layer 114. In some embodiments, the dielectric material layer 124 includes LTO or MTO formed by a LTO or a MTO process. In some embodiments, silicon-containing precursor and oxygen plasma are used for forming the dielectric material layer 124. In some embodiments, the material of the dummy contact 122 may react with the oxygen plasma during the formation of the dielectric material layer 124. In other words, a portion of the dummy contact 122 may be consumed by the oxygen plasma during the formation of the dielectric material layer 124, and a dummy contact 122a may be remained with a re-entrant profile. However, the disclosure is not limited thereto.

Figure 12A:
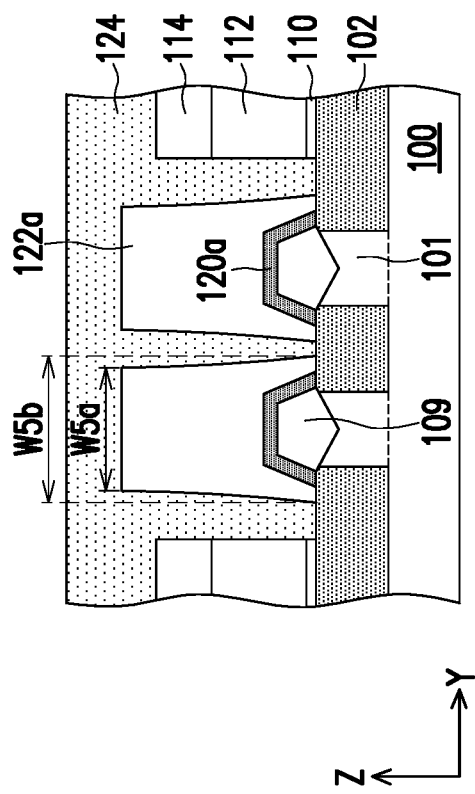
Figure 12B:
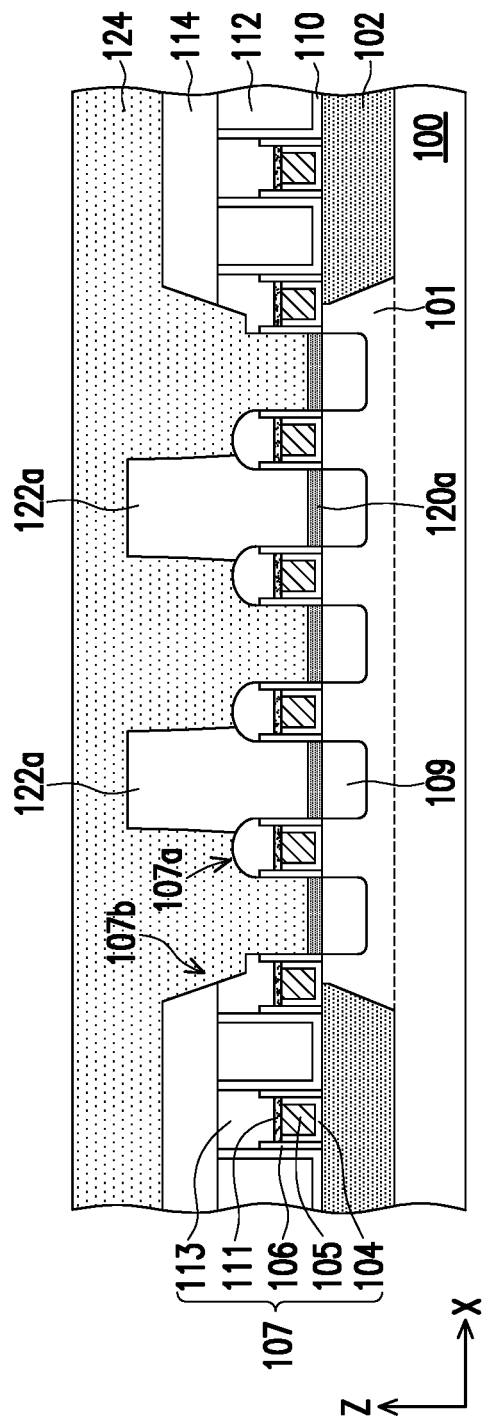

In some embodiments, before the formation of the dielectric material layer 124, as shown in FIG. 11A and FIG. 11B, the dummy contact 122 has substantially straight sidewalls, and the dummy contact 122 has a substantially uniform width W5 from top to bottom along the direction Y. In some embodiments, after the formation of the dielectric material layer 124, as shown in FIG. 12A and FIG. 12B, the dummy contact 122a has non-straight sidewalls and has non-uniform widths from top to bottom. In some embodiments, as shown in FIG. 12A, the bottom width W5b may be larger than the top width W5a. The bottom width W5b may be substantially equal to or slightly less than the width W5 of the dummy contact 122. In some embodiments, the width of the dummy contact 122a along the direction Y is gradually reduced from bottom to top, as shown in FIG. 12A.

In some embodiments, the oxygen plasma may further penetrate through the dummy contact 122a and oxidize the S/D regions 109, resulting in a thicker native oxide layer 120a. In some embodiments, the dummy contact 122 (FIG. 11A/11B) is formed to have the suitable width W5, such that the dummy contact 122a still have sufficient width after being consumed, thereby guaranteeing the subsequently formed contact hole has sufficient space for contact landing. In some embodiments, the dummy contact 122a has a sufficient width such that the S/D regions 109 for contact landing and the native oxide layer 120a formed thereon are completely covered by the dummy contact 122a.

Figure 7A:
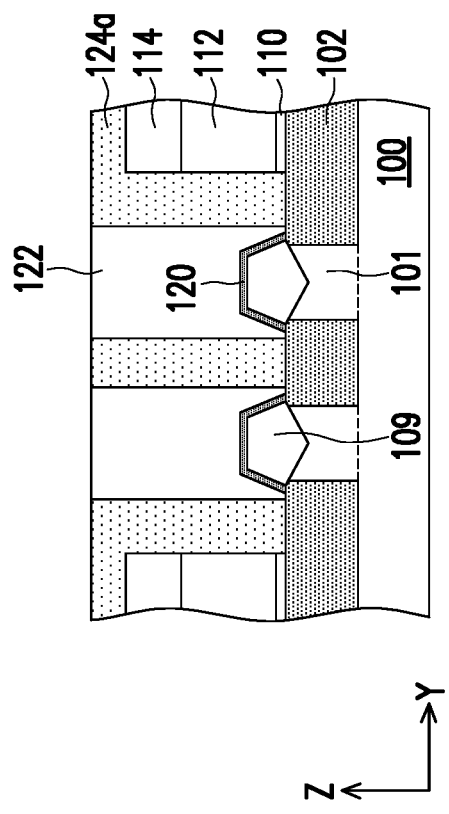
Figure 7B:
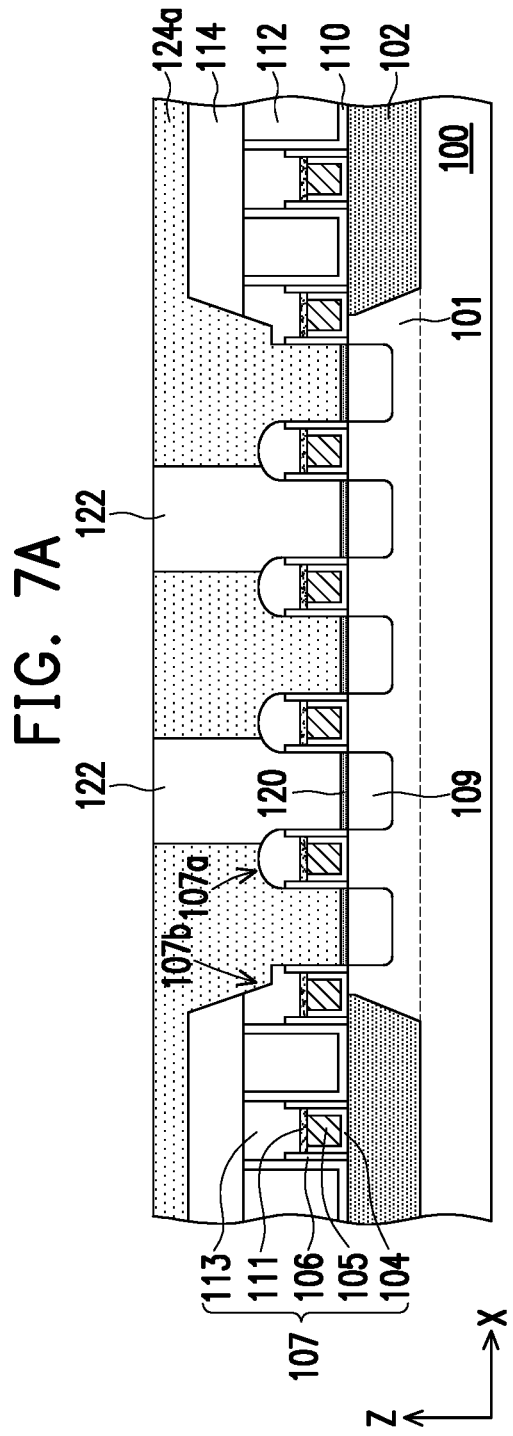
Figure 13A:
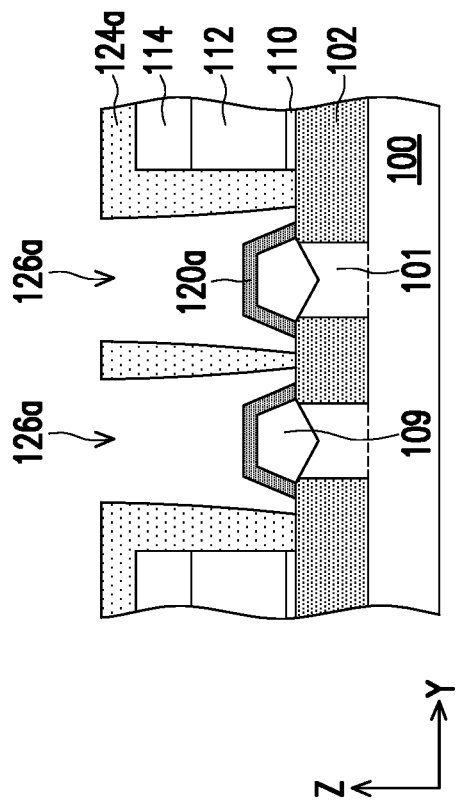
Figure 13B:
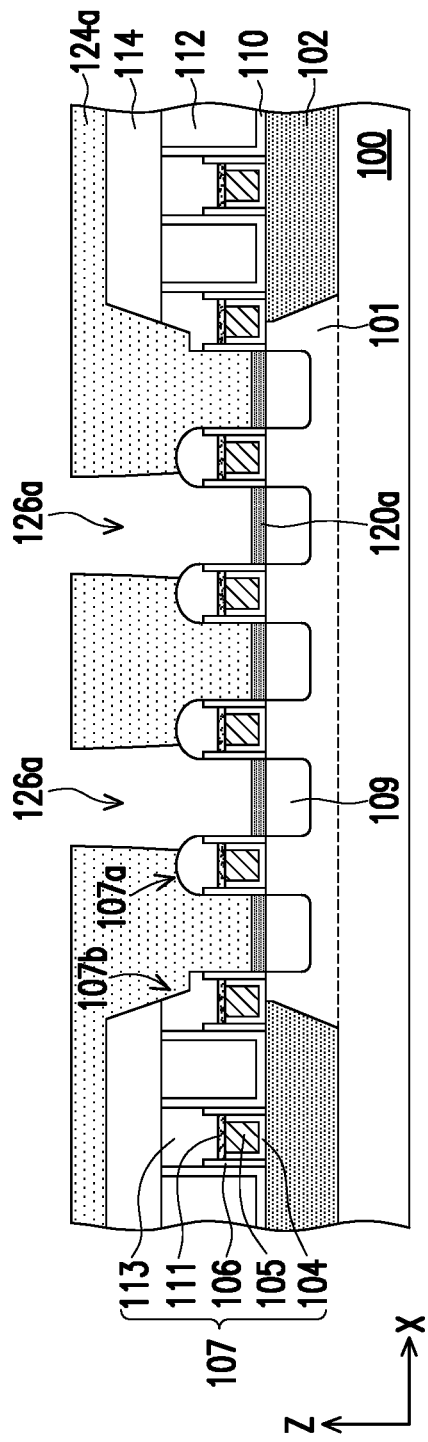

Referring to FIG. 13A and FIG. 13B, processes similar to those described in FIG. 7A/7B to 8A/8B are performed. An etching back process or a planarization process may be performed to remove a portion of the dielectric material layer 124, so as to expose the top surfaces of the dummy contacts 122a, and a dielectric layer 124a is formed. Thereafter, the dummy contacts 122a are removed to form contact holes 126a. In such embodiments, the contact holes 126a have non-uniform widths. In some embodiments, after the dummy contact 122a is removed, the native oxide layer 120a covering the S/D regions 109 are completely exposed by the contact holes 126a. In some embodiments, through forming the dummy contact 122 with the above-described suitable dimension, the contact hole 126a is formed to have a sufficient dimension, such that the native oxide layer 120a covering the S/D region 109 may be completely removed in subsequent process, and enough space is provided for contact landing.

Referring to FIG. 13A and FIG. 13B to FIG. 14A and FIG. 14B, thereafter, processes similar to those described in FIG. 9A/9B to 10A/10B are performed. The native oxide layer 120a is removed by wet cleaning process or an etching process, and a silicide layer 127 is formed on the S/D region 109. Thereafter, contacts 128 are then formed to connect to the S/D region 109.

As such, a semiconductor device 200b is thus formed. The semiconductor device 200b is similar to the semiconductor device 200a, except that the contact 128 of the semiconductor device 200b has non-uniform width from bottom to top. In some embodiments, as shown in FIG. 14A, the width of the contact 128 along the direction Y is gradually reduced form bottom to top. The bottom width W5b' of the contact 128 is larger than the top width W5a' of the contact 128. In some embodiments, the bottom width W5b' is still larger than the width W1 of the S/D region 109 (with the silicide layer 127). In other words, the contact 128 is tapered away from the substrate 100. The sidewalls of the contact 128 may be inclined or arced. In some embodiments, as shown in FIG. 14B, along the direction X, the width of the bottom portion of the contact 128 laterally between the gate structures 107a may be substantially uniform, and the width of the contact 128 from its middle to top may be gradually reduced.

FIG. 15A and FIG. 15B to FIG. 19A and FIG. 19B are schematic cross-sectional views illustrating intermediate stage of a method for forming a semiconductor device according to a third embodiment of the disclosure. The third embodiment differs from the foregoing embodiments in that a protection layer is formed on the dummy contacts before forming the additional dielectric material layer.

Figure 15A:
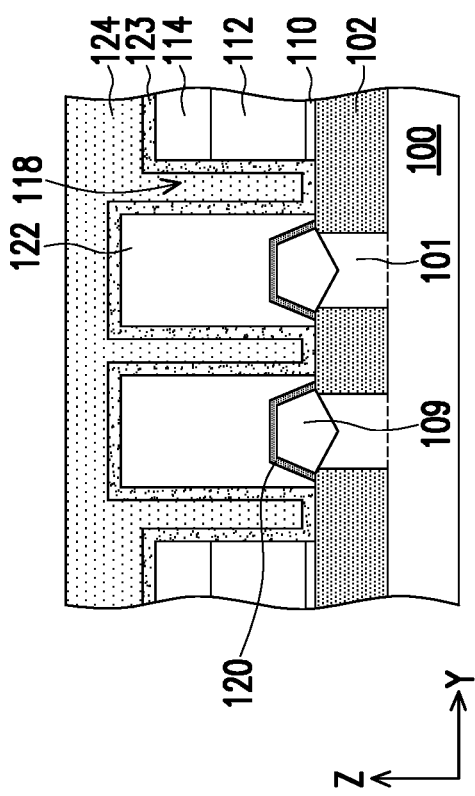
Figure 15B:
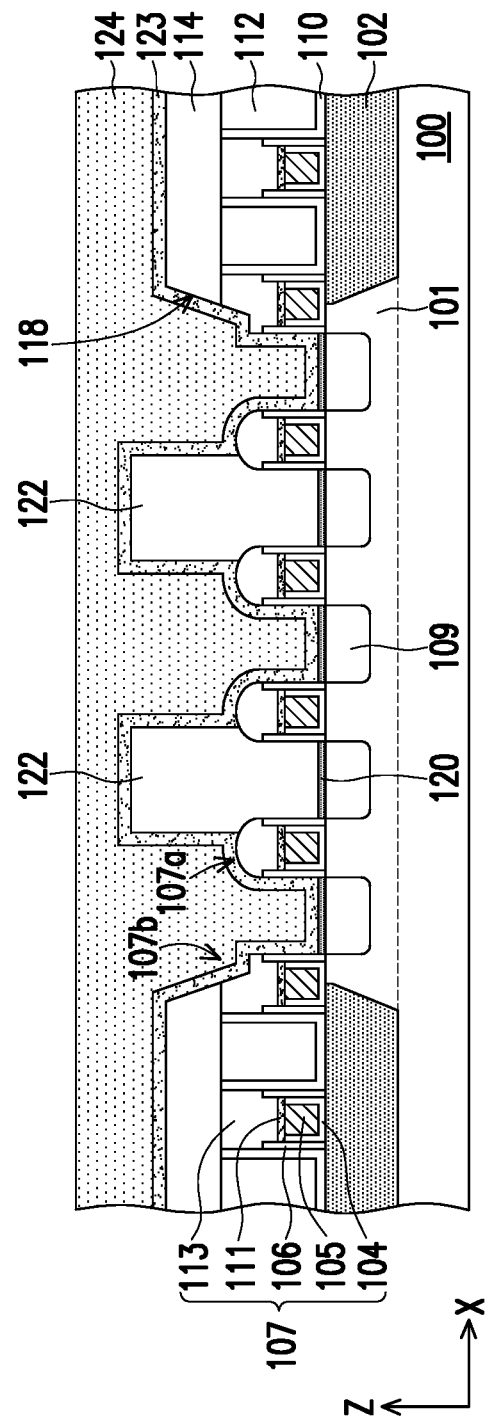
Figure 16A:
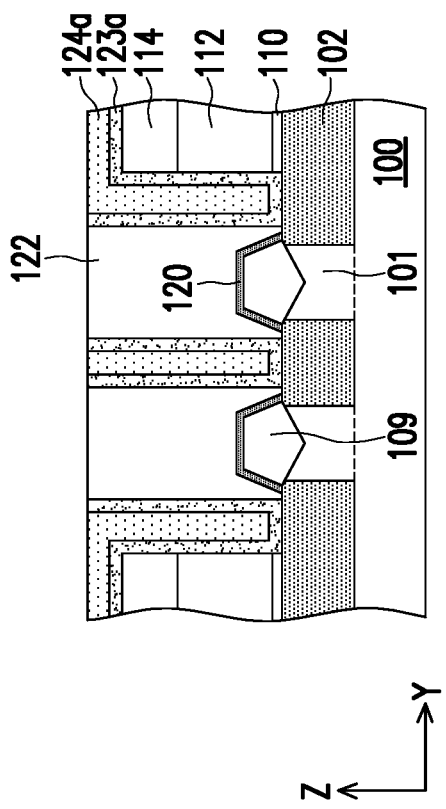
Figure 16B:
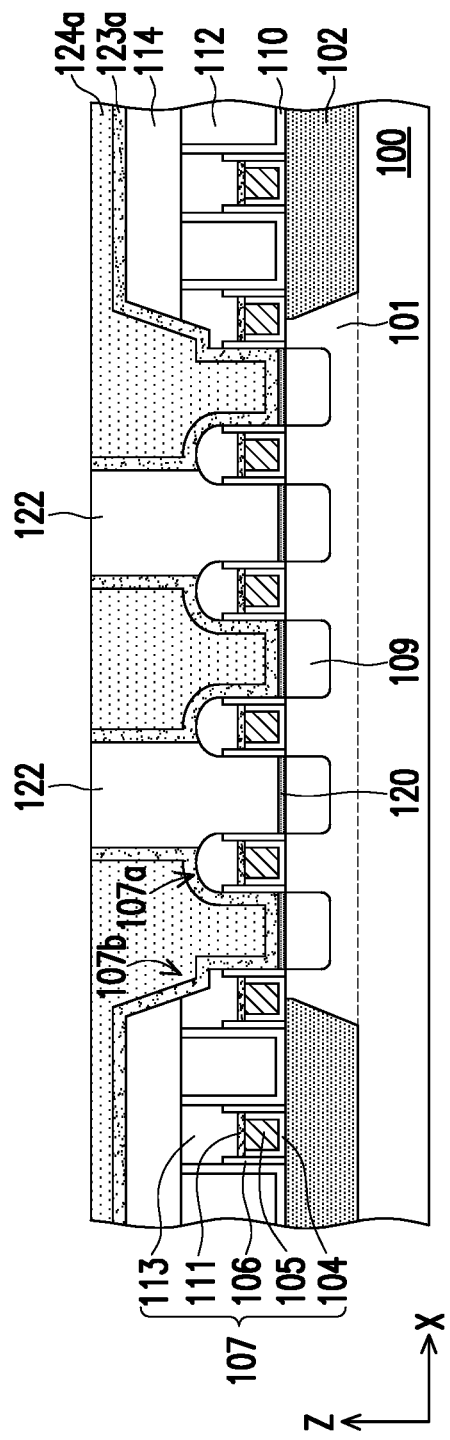

Referring to FIG. 5A/5B and FIG. 15A/15B, in some embodiments, after the opening 118 is formed in the dielectric layers 112/114 and dummy contacts 122 are formed on the S/D regions 109, a protection material layer 123 is formed over the substrate 100. In some embodiments, the protection material layer 123 is a conformal layer. Herein, "conformal layer" refers to a layer having a substantially equal thickness extending along the region on which the layer is formed. The protection material layer 123 fills into the opening 118 and cover the top surface of the dielectric layer 114. In other words, the protection material layer 123 lines the surfaces of the dummy contact 122, the isolation structure 102 of the substrate 100, the gate structures 107a and 107b, the S/D regions 109, the sidewalls of the etching stop layer 110, the dielectric layers 112/114 and the top surface of the dielectric layer 114.

In some embodiments, the protection material layer 123 includes a material different from the material of the dummy contact 122. In some embodiments, suitable materials are selected to form the protection material layer 123, such that the protection material layer 123 may protect the dummy contact 122 in subsequent processes. In some embodiments, the protection layer 123 is not susceptible to oxygen plasma and may prevent oxygen plasma penetration. For example, the protection material layer 123 may include a dielectric material, such as aluminum oxide ($Al_2O_3$), SiCN, silicon nitride (e.g. SiN), SiCO, or the like, or combinations thereof. Other suitable dielectric material may also be used as long as it can protect the dummy contact in subsequent process. In some embodiments, the protection material layer 123 is formed by a suitable deposition process, such as ALD. The protection material layer 123 may be deposited at a relatively low temperature, such as lower than 200° C. In some embodiments, the thickness of the protection material layer 123 may range from 30 to 50 angstroms (Å), 10 angstroms or more, 28 angstroms, 30 angstroms or more, 54 angstroms. For example, the protection material layer 123 may be a $Al_2O_3$ layer with a thickness of 10 angstroms or more, a SiCN layer with a thickness of 30 angstroms or more, a SiN layer with a thickness of 30 angstroms or more, or a SiCO layer with a thickness of 30 angstroms or more. In some embodiments, the material and thickness of the protection material layer 123 are selected to be resistant to oxygen plasma.

The dielectric material layer 124 is formed on the protection material layer 123 after the formation of the protection material layer 123. The dielectric material layer 124 covers the protection material layer 123 and fills remaining portions of the opening 118 not filled by the protection material layer 123. In some embodiments, the top surface of the dielectric material layer 124 is higher than the topmost surface of the protection material layer 123. The material and forming method of the dielectric material layer 124 are the same as those descried in the foregoing embodiment, which are not described again here. For example, the dielectric material layer 124 may include a MTO or LTO formed by a MTO or LTO process. In some embodiments, as described above, oxygen plasma may be used for forming the dielectric material layer 124. In this embodiment, since the protection material layer 123 is formed on the dummy contacts 122, the dummy contacts 122 may be protected by the protection material layer 123 from the oxygen plasma, and the potential damage of dummy contacts 122 which may be caused by the oxygen plasma is thus avoided. In addition, the presence of the protection material layer 123 prevents the oxygen plasma from penetrating through the protection material layer 123 and the dummy contact 122, thereby avoiding the further oxidation of the S/D region 109. In some embodiments, with the protection material layer 123, the shape and dimension of the dummy contact 122 after the formation of the dielectric material layer 124 are maintained as the same as those of the dummy contact 122 before the formation of the dielectric material layer 124.

Referring to FIG. 15A and FIG. 15B to FIG. 16A and FIG. 16B, in some embodiments, a planarization process is performed to at least remove portions of the dielectric material layer 124, and the protection material layer 123 over the top surfaces of the dummy contacts 122, so as to expose the top surfaces of the dummy contacts 122, and a protection layer 123a and a dielectric layer 124a are formed. In some embodiments, the planarization process stops when top surfaces of the dummy contacts 122 are reached. However, the disclosure is not limited thereto. In alternative embodiments, the planarization process may further remove portions of the dummy contacts 122 and stop when the top surface of the protection layer 123 on the dielectric layer 114 is reached. After the planarization process is performed, the top surfaces of the dummy contact 122, the topmost surface of the protection layer 123a and the top surface of the dielectric layer 124a are substantially coplanar with each other. However, the disclosure is not limited thereto. In yet another embodiment, the planarization process may stop when the top surface of the dielectric layer 114 is reached.

Figure 17A:
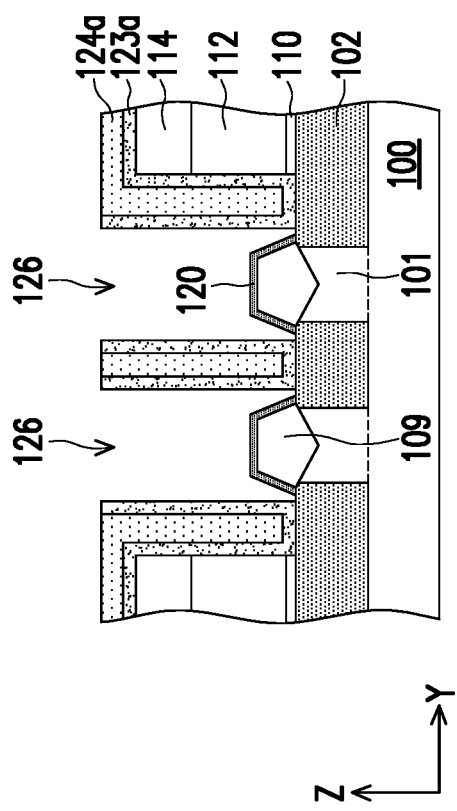
Figure 17B:
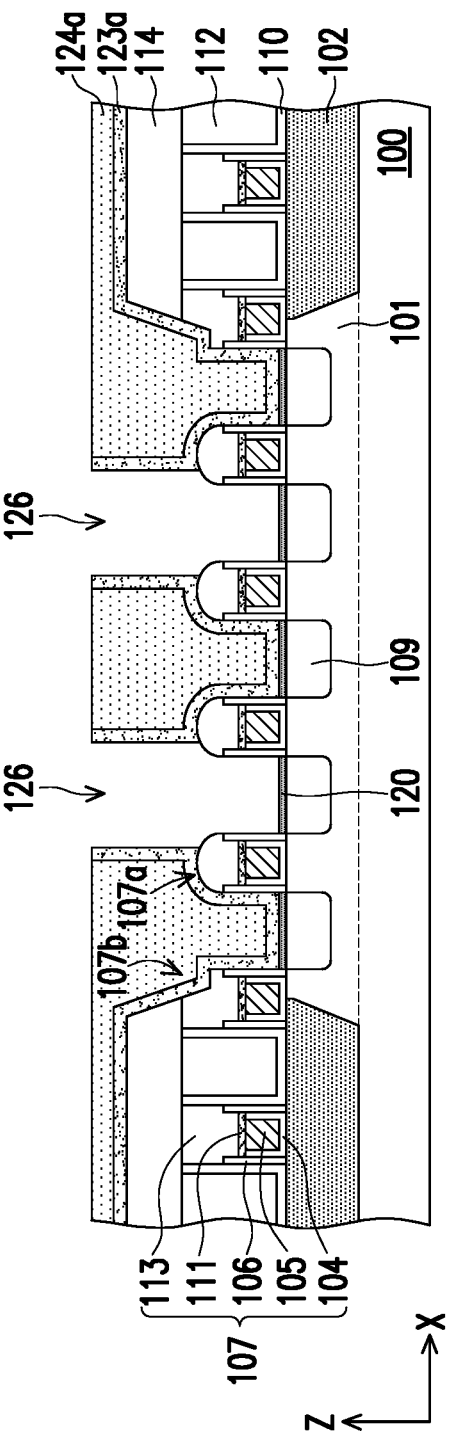
Figure 18A:
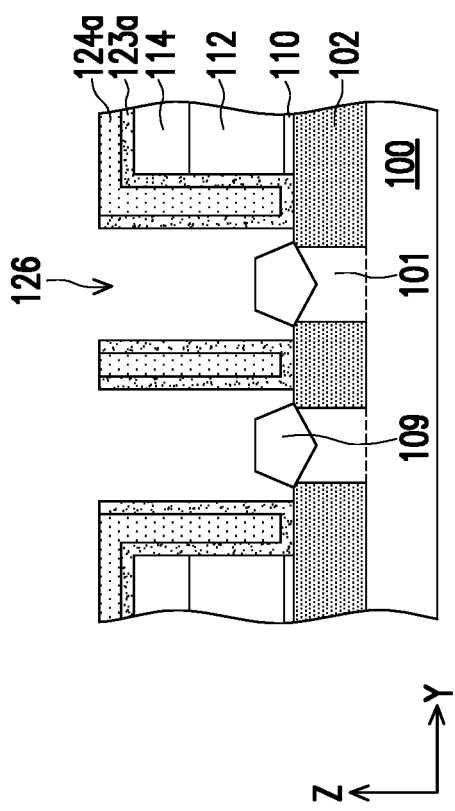
Figure 18B:
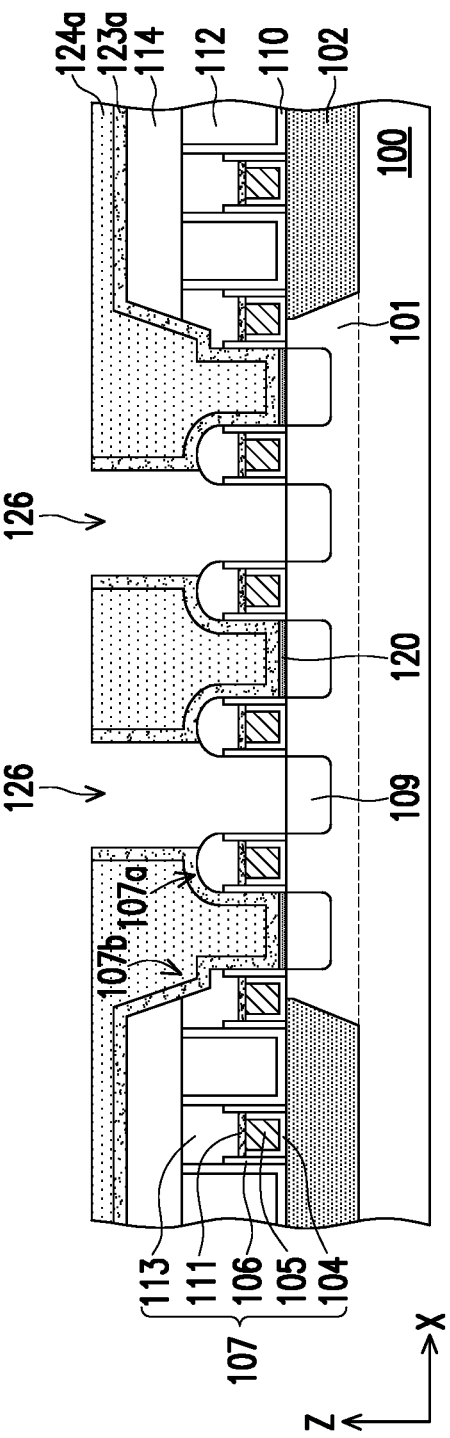

Referring to FIG. 17A and FIG. 17B, the dummy contacts 122 (shown in FIG. 16A/16B) are removed, so as to form contact holes 126. In some embodiments, the contact holes 126 are defined between sidewalls of the vertical portions of the protection layer 123a. The contact hole 126 exposes the native oxide layer 120 on the S/D region 109.

Referring to FIG. 18A and FIG. 18B to FIG. 19A and FIG. 19B, processes similar to those described in FIG. 9A/9B to 10A/10B are performed, the native oxide layers 120 exposed in the contact holes 126 are removed from the S/D regions 109, the silicide layers 127 are then formed on the S/D regions 109 exposed by the contact holes 126, and contacts 128 are formed in the contact holes 126 to connect to the S/D regions 109. As such, a semiconductor device 200c is thus formed.

Referring to FIG. 19A and FIG. 19B, the semiconductor device 200c includes the substrate 100 having a plurality of fins 101 and isolation structure 102, the gate structures 107, 107a, 107b, the S/D regions 109, the etching stop layer 110, the ILDs 112 and 114, the protection layer 123a, the additional dielectric layer 124a and the contacts 128. The structure of the semiconductor device 200c is similar to that of the semiconductor device 200a, except that the semiconductor device 200c further includes the protection layer 123a.

In some embodiments, the protection layer 123a is disposed between the additional dielectric layer 124a and adjacent layers underlying or laterally aside the additional dielectric layer 124a. For example, as shown in FIG. 19A, some portions (e.g. vertical portion) of the protection layer 123a are disposed on sidewalls of the contact 128 and laterally sandwiched between the contact 128 and the additional dielectric layer 124a. Some portions of the protection layer 123a are disposed on sidewalls of the ILDs 112/114 and sidewalls of the etching stop layer 110, and laterally sandwiched between the ILDs 112/114 and the additional dielectric layer 124a. some portions (e.g. horizontal portion) of the protection layer 123a may cover the top surface of the isolation structure 102 and/or the top surface of the dielectric layer 114, and vertically between the additional dielectric layer 124a and the isolation structure 102 of the substrate 100 and/or vertically between the ILD 114 and the additional dielectric layer 124a. In other words, the contacts 128 are separated from the additional dielectric layer 124a by the protection layer 123a therebetween; the ILDs 112/114 are separated from the additional dielectric layer 124a by the protection layer 123a therebetween. In some embodiments, the top surface of the additional dielectric layer 124a, the top surface of the contact 128 and the topmost surface of the protection layer 123a are substantially coplanar with each other.

In some embodiments, as shown in FIG. 19B, the protection layer 123a may cover portions of the gate structures 107a and 107b and disposed between the additional dielectric layer 124a and the gate structures 107a/107b.

Figure 20A:
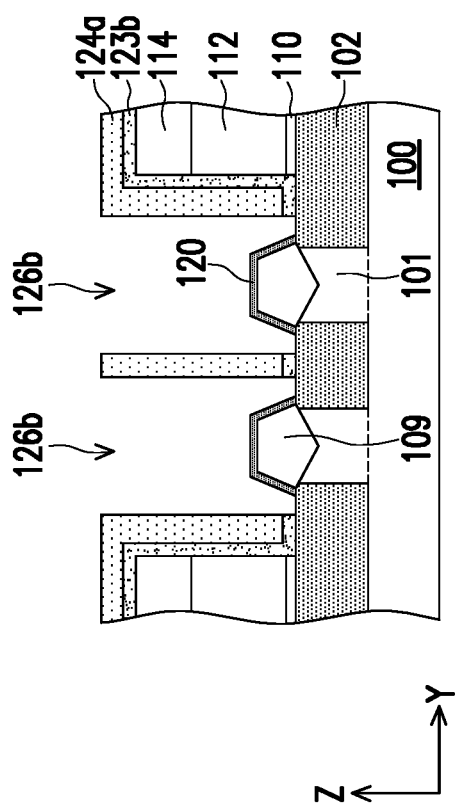
Figure 20B:
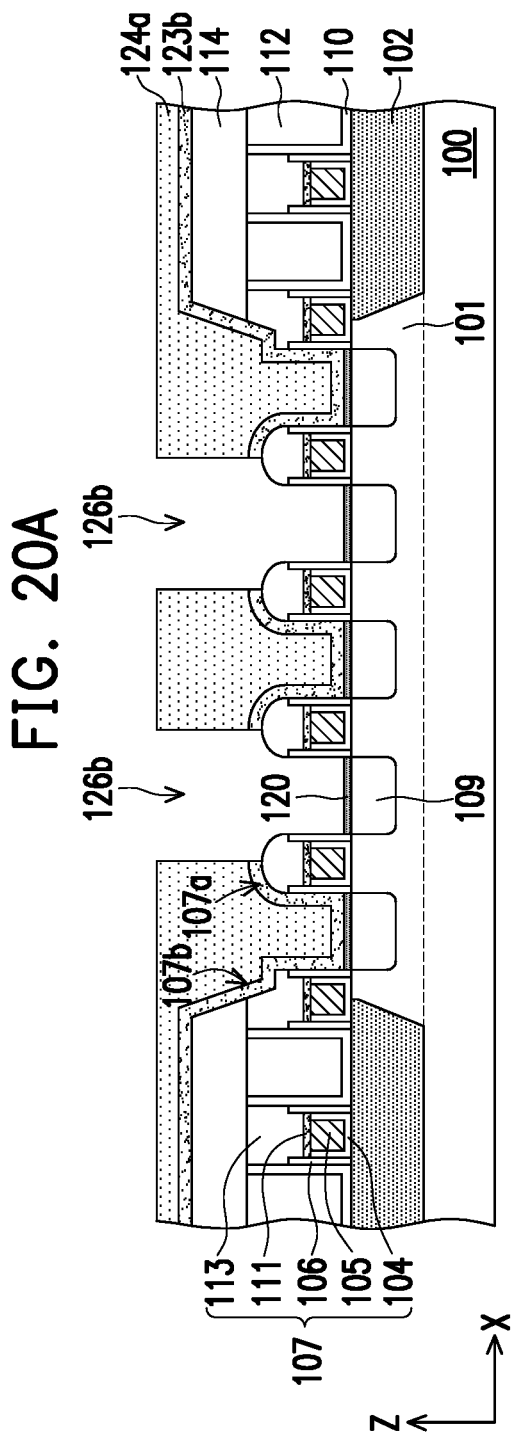

FIG. 20A and FIG. 20B to FIG. 22A and FIG. 22B are schematic cross-sectional views illustrating intermediate stages for forming a semiconductor device according to a fourth embodiment of the disclosure, wherein FIG. 20A and FIG. 20B illustrates an intermediate stage following the process shown in FIG. 17A and FIG. 17B according to the fourth embodiment of the disclosure. The fourth embodiment is similar to the third embodiment except that the protection layer is not formed on sidewalls of the contact.

Referring to FIG. 17A and FIG. 17B to FIG. 20A and FIG. 20B, in some embodiments, after the dummy contacts 122 (FIG. 16A/16B) are removed and the contact holes (or referred to as initial contact holes) 126 are formed as shown in FIG. 17A and FIG. 17B, the vertical portions of the protection layer 123a exposed by the contact hole 126 are further removed, so as to form contact holes 126b, and a protection layer 123b is formed. In such embodiments, the contact hole 126b has a larger width than the initial contact hole 126 (FIG. 17A/17B) due to the removal of portions of the protection layer 123a, thereby providing a larger area for contact landing. In some embodiments, the removal of the portions of the protection layer 123a may include an etching process, such as wet etching process, dry etching process or a combination thereof. In some embodiments, the etchant used for removing the protection layer 123a may include ammonia solution.

Referring to FIG. 21A and FIG. 21B to FIG. 22A and FIG. 22B, processes similar to those described in FIG. 9A/9B to 10A/10B are performed, the native oxide layers 120 are removed from the S/D regions 109, and the silicide layers 127 are formed on the S/D region 109. The contacts 128 are then formed in the contact hole 126b to connect to the S/D regions 109. As such, a semiconductor device 200d is thus formed.

Figure 22A:
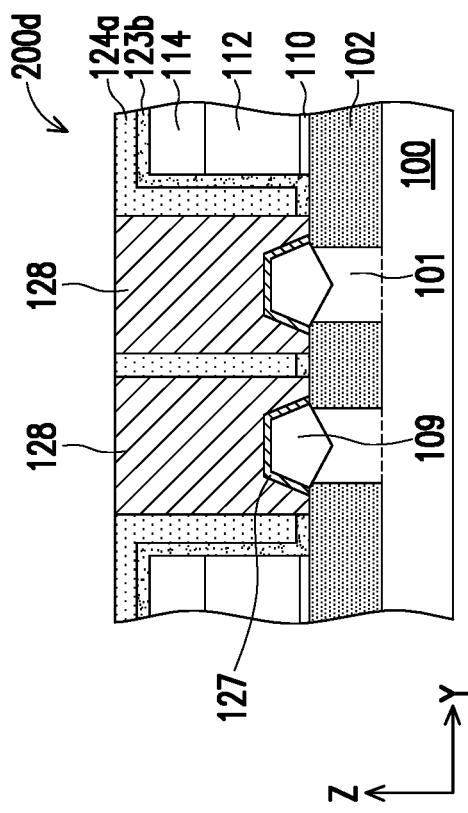
Figure 22B:
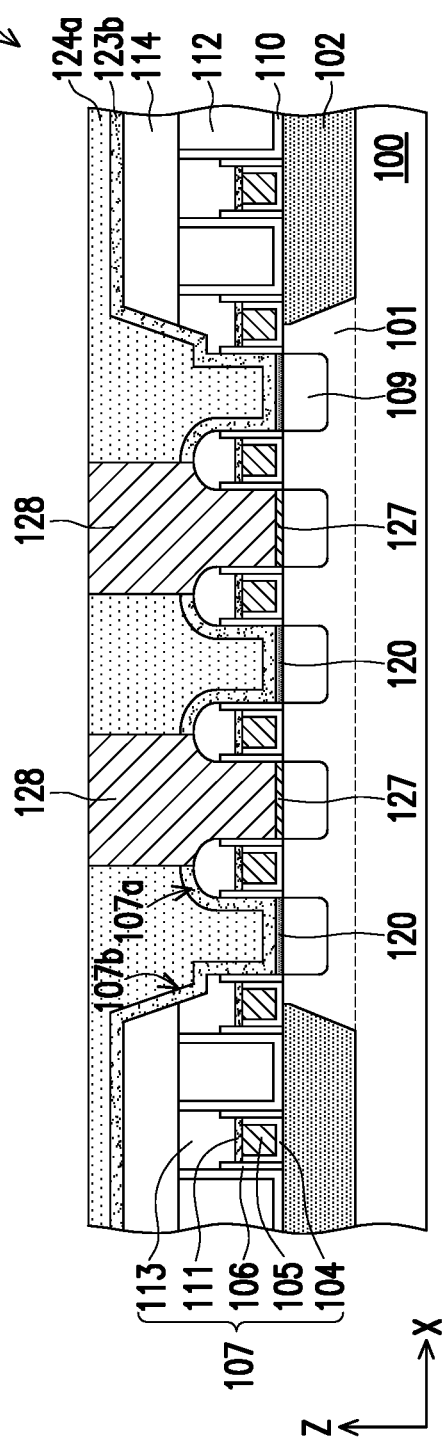

Referring to FIG. 22A and FIG. 22B, the semiconductor device 200d includes the substrate 100 having a plurality of fins 101 and isolation structure 102, the gate structures 107, 107a, 107b, the S/D regions 109, the etching stop layer 110, the ILDs 112 and 114, the protection layer 123b, the additional dielectric layer 124a and the contacts 128. The structure of the semiconductor device 200d is similar to that of the semiconductor device 200c, except that the protection layer 123b does not include vertical portions on sidewalls of the contacts 128. In some embodiments, the protection layer 123b is disposed between the additional dielectric layer 124a and the substrate 100, between the additional dielectric layer 124a and the ILDs 112/114, and between the additional dielectric layer 124a and the gate structures 107a and 107b. The sidewalls of the contact 128 are covered by and in physical with the additional dielectric layer 124a and the protection layer 123b. In some embodiments, a bottom portion of the sidewalls of the contact 128 is covered by the protection layer 123b, and other portions of the sidewalls of the contact 128 are covered by the additional dielectric layer 124a. The other structural features of the semiconductor device 200d are similar to those of the semiconductor device 200c and 200a, which are not described again here.

FIG. 23 to FIG. 26 are cross-sectional views illustrating semiconductor devices according to some other embodiment of the disclosure.

Referring to FIG. 23 and FIG. 24, semiconductor devices 200a' and 200b' respectively similar to the semiconductor device 200a (FIG. 10A) and the semiconductor device 200b (FIG. 14A) are illustrated, except that, the top surface of the additional dielectric layer 124a and the top surfaces of the contacts 128 are substantially coplanar with the top surface the dielectric layer 114.

Referring to FIG. 25 to FIG. 26, semiconductor device 200c' and 200d' respectively similar to the semiconductor device 200c (FIG. 19A) and the semiconductor device 200d (FIG. 22A) are illustrated. As shown in FIG. 25 and FIG. 26, in some embodiments, the additional dielectric layer 124a is not disposed on topmost surface of the protection layer 123a/123b, and the top surface of the additional dielectric layer 124a may be substantially coplanar with the top surfaces of the contacts 128 and topmost surfaces of the protection layer 123a/123b. In alternative embodiments, as illustrated as the dashed line, the top surface of the additional dielectric layer 124a, the top surfaces of the contacts 128 and the topmost surface of the protection layer 123a/123b may be substantially coplanar with the top surface of the dielectric layer 114.

In the embodiments of the disclosure, the contact is formed by a contact replacement process (or referred to as a contact last process), though which the contact hole and the contact formed therein are formed to have sufficient dimension, such that the contact wraps around the S/D region. As such, the landing area (or contact area) of the contact on the S/D region is increased. In some embodiments of the disclosure, a protection layer is formed on the dummy contact to protect the dummy contact from the oxygen during the formation of the additional dielectric layer, thereby maintaining the dimension and shape of the dummy contact, so as to form the contact hole with sufficient dimension for contact landing.

In accordance with some embodiments of the disclosure, a semiconductor device includes a substrate, a gate structure on the substrate, a source/drain (S/D) region and a contact. The S/D region is located in the substrate and on a side of the gate structure. The contact lands on and connected to the S/D region. The contact wraps around the S/D region.

In accordance with alternative embodiments of the disclosure, a FinFET device includes a substrate, a gate structure, a S/D region, a contact, an interlayer dielectric layer and an additional dielectric layer. The substrate has a fin and an isolation structure aside the fin. The gate structure is on the substrate and across the fin. The S/D region is in and/or on the fin of the substrate and on a side of the gate structure. The contact is laterally aside the gate structure and landing on the S/D region. The interlayer dielectric layer is on the substrate and laterally aside the contact. The additional dielectric layer is laterally between the contact and the interlayer dielectric layer.

In accordance with some embodiments of the disclosure, a method of forming a semiconductor device includes: providing a substrate having a fin and an isolation structure aside the fin; forming a gate structure across the fin; forming a S/D region in and/or on the fin and aside the gate structure; forming an interlayer dielectric layer on the substrate to cover the gate structure and the S/D region; removing a portion of the interlayer dielectric layer to form an opening exposing the S/D region and the isolation structure adjacent to the S/D region; forming a dummy contact to cover the S/D region exposed by the opening; forming an additional dielectric layer to fill the opening and laterally aside the dummy contact; and replacing the dummy contact with a contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    providing a substrate having a fin and an isolation structure aside the fin;
    forming a gate structure across the fin;
    forming a S/D region in and/or on the fin and aside the gate structure;
    forming an interlayer dielectric layer on the substrate to cover the gate structure and the S/D region;
    removing a portion of the interlayer dielectric layer to form an opening exposing the S/D region and the isolation structure adjacent to the S/D region;
    forming a dummy contact to cover the S/D region exposed by the opening;
    forming a protection layer to cover sidewalls of the dummy contact;
    forming an additional dielectric layer to fill the opening and laterally aside the dummy contact;
    removing the dummy contact; and
    removing a portion of the protection layer previously covering the sidewalls of the dummy contact.

2. The method of claim 1, further comprising forming a contact after removing the portion of the protection layer.

3. The method of claim 1, wherein forming the protection layer and the additional dielectric layer comprises:
    forming a protection material layer to cover the sidewalls and a top surface of the dummy contact;
    forming an additional dielectric material layer on the protection material layer; and
    performing a planarization process to remove portions of the additional dielectric material layer and the protection material layer over the top surface of the dummy contact.

4. The method of claim 1, wherein removing the dummy contact and removing the portion of the protection layer previously covering the sidewalls of the dummy contact comprises:
    forming a contact hole in the additional dielectric layer.

5. The method of claim 4, further comprising forming the contact in the contact hole to connect to the S/D region and be in contact with a top surface of the isolation structure and the protection layer.

6. The method of claim 1, wherein forming the protection layer and the additional dielectric layer comprises:
    forming a protection material layer to cover the sidewalls and a top surface of the dummy contact;
    forming an additional dielectric material layer on the protection material layer; and
    performing a planarization process to remove portions of the additional dielectric material layer and the protection material layer over the top surface of the dummy contact.

7. A method of forming a semiconductor device, comprising:
    providing a substrate having a fin and an isolation structure aside the fin;
    forming a gate structure over the fin;
    forming a S/D region aside the gate structure;
    forming a dummy contact to cover the S/D region and be in contact with a top surface of the isolation structure;
    forming a protection layer to cover the dummy contact and the top surface of the isolation structure;
    removing the dummy contact to form a contact hole;
    forming a silicide layer on the S/D region in the contact hole, and having a lower portion in contact with the top surface of the isolation structure previously in contact with the dummy contact; and
    forming a contact on the silicide layer, covering the lower portion of the silicide layer and separated the lower portion of the silicide layer from the protection layer.

8. The method of claim 7, wherein before forming the dummy contact, further comprising:
    forming an interlayer dielectric layer on the substrate to cover the gate structure and the S/D region; and
    removing a portion of the interlayer dielectric layer to form an opening exposing the S/D region and the top surface of the isolation structure.

9. The method of claim 8, wherein after forming the protection layer, further comprising:
    forming an additional dielectric layer over the protection layer to fill the opening and laterally aside the dummy contact.

10. The method of claim 9, wherein forming the protection layer and the additional dielectric layer comprises:
    forming a protection material layer to cover sidewalls and a top surface of the dummy contact;
    forming an additional dielectric material layer on the protection material layer; and
    performing a planarization process to remove portions of the additional dielectric material layer and the protection material layer over the top surface of the dummy contact.

11. The method of claim 9, wherein after removing the dummy contact, further comprising:
    removing a portion of the protection layer previously covering sidewalls of the dummy contact.

12. The method of claim 11, wherein the contact is formed to be in contact with the protection layer and the additional dielectric material layer.

13. The method of claim 8, wherein after forming the opening, further comprising:
    oxidizing a surface of the S/D region exposed by the opening to form a native oxide layer.

14. The method of claim 13, wherein after removing the dummy contact, further comprising:
    performing a clean process to remove the native oxide layer.

15. A method of forming a semiconductor device, comprising:
    providing a substrate having an active region and an isolation structure aside the active region;
    forming a gate structure over the active region;
    forming a S/D region in the substrate and on a side of the gate structure;

forming a dummy contact to cover the S/D region and a top surface of the isolation structure adjacent to the S/D region;

forming an additional dielectric layer laterally aside the dummy contact;

removing the dummy contact to form a contact hole;

forming a silicide layer in contact with the top surface of the isolation structure previously in contact with the dummy contact on the S/D region in the contact hole; and forming a contact wrapping around the silicide layer and the S/D region, and having a lower portion in contact with the top surface of the isolation structure previously in contact with the dummy contact and in contact with the additional dielectric layer.

16. The method of claim 15, wherein before forming the dummy contact, further comprising:

forming an interlayer dielectric layer on the substrate to cover the gate structure and the S/D region; and removing a portion of the interlayer dielectric layer to form an opening exposing the S/D region and the top surface of the isolation structure.

17. The method of claim 15, wherein the additional dielectric layer includes low temperature oxide or medium temperature oxide formed by a low temperature oxide process or a medium temperature deposition process.

18. The method of claim 15, wherein the additional dielectric layer is formed by using silicon-containing precursor and oxygen plasma.

19. The method of claim 18, wherein during the formation of the additional dielectric layer, a material of the dummy contact reacts with the oxygen plasma.

20. The method of claim 19, wherein the dummy contact has non-straight sidewalls and has non-uniform widths from top to bottom.

* * * * *